(12) United States Patent
Kim et al.

(10) Patent No.: US 7,799,629 B2
(45) Date of Patent: Sep. 21, 2010

(54) MEMORY DEVICE AND METHOD OF MANUFACTURING THE SAME

(75) Inventors: Na-Young Kim, Seoul (KR); Chang-Woo Oh, Suwon-si (KR); Sung-Hwan Kim, Suwon-si (KR); Yong-Lack Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 12/385,496

(22) Filed: Apr. 9, 2009

(65) Prior Publication Data

US 2009/0203178 A1    Aug. 13, 2009

Related U.S. Application Data

(62) Division of application No. 11/652,552, filed on Jan. 12, 2007, now Pat. No. 7,535,051.

(30) Foreign Application Priority Data

Oct. 20, 2006  (KR) ...................... 10-2006-0102190

(51) Int. Cl.
*H01L 21/8238* (2006.01)
(52) U.S. Cl. ................ 438/216; 438/221; 438/232; 438/257; 438/266; 438/287; 257/288; 257/298; 257/314; 257/321; 257/365; 257/E21.209

(58) Field of Classification Search ............... 257/386
See application file for complete search history.

(56) References Cited

U.S. PATENT DOCUMENTS

2004/0227180 A1 * 11/2004 Huang et al. ................ 257/324

FOREIGN PATENT DOCUMENTS

| KR | 1020040064053 A | 7/2004 |
| KR | 1020060027749 A | 3/2006 |
| KR | 1020060053068 A | 5/2006 |

* cited by examiner

*Primary Examiner*—N Drew Richards
*Assistant Examiner*—Kyoung Lee
(74) *Attorney, Agent, or Firm*—Harness, Dickey & Pierce, P.L.C.

(57) ABSTRACT

A example embodiment may provide a memory device that may include an active pattern on a semiconductor substrate, a first charge trapping layer pattern on the active pattern, a first gate electrode on the first charge trapping layer pattern, a second charge trapping layer pattern on a sidewall of the active pattern in a first direction, a second gate electrode on the second charge trapping layer pattern in the first direction, and/or a source/drain region in the active pattern. The memory device may have improved integration by forming a plurality of charge trapping layer patterns on the same active pattern.

21 Claims, 31 Drawing Sheets

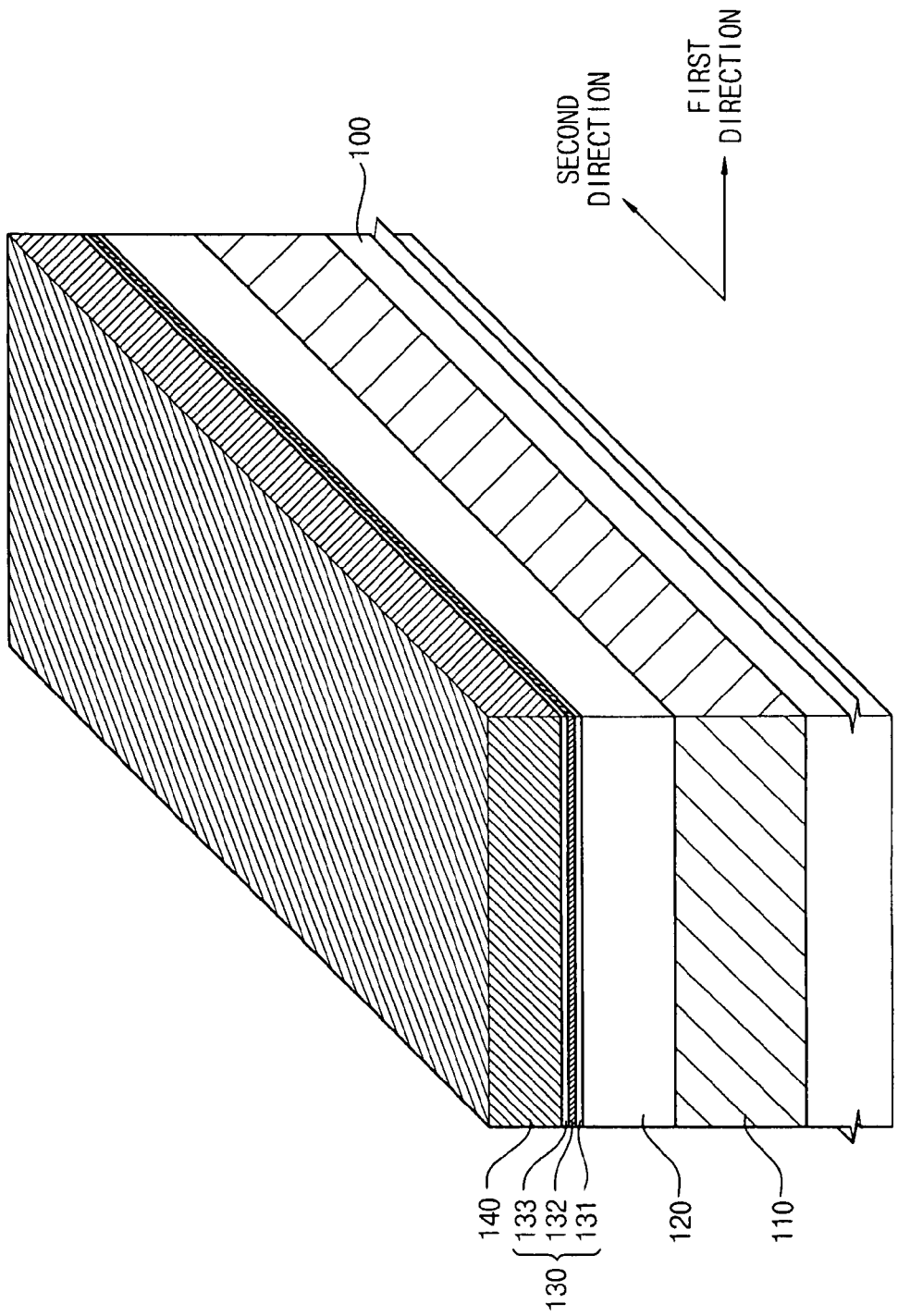

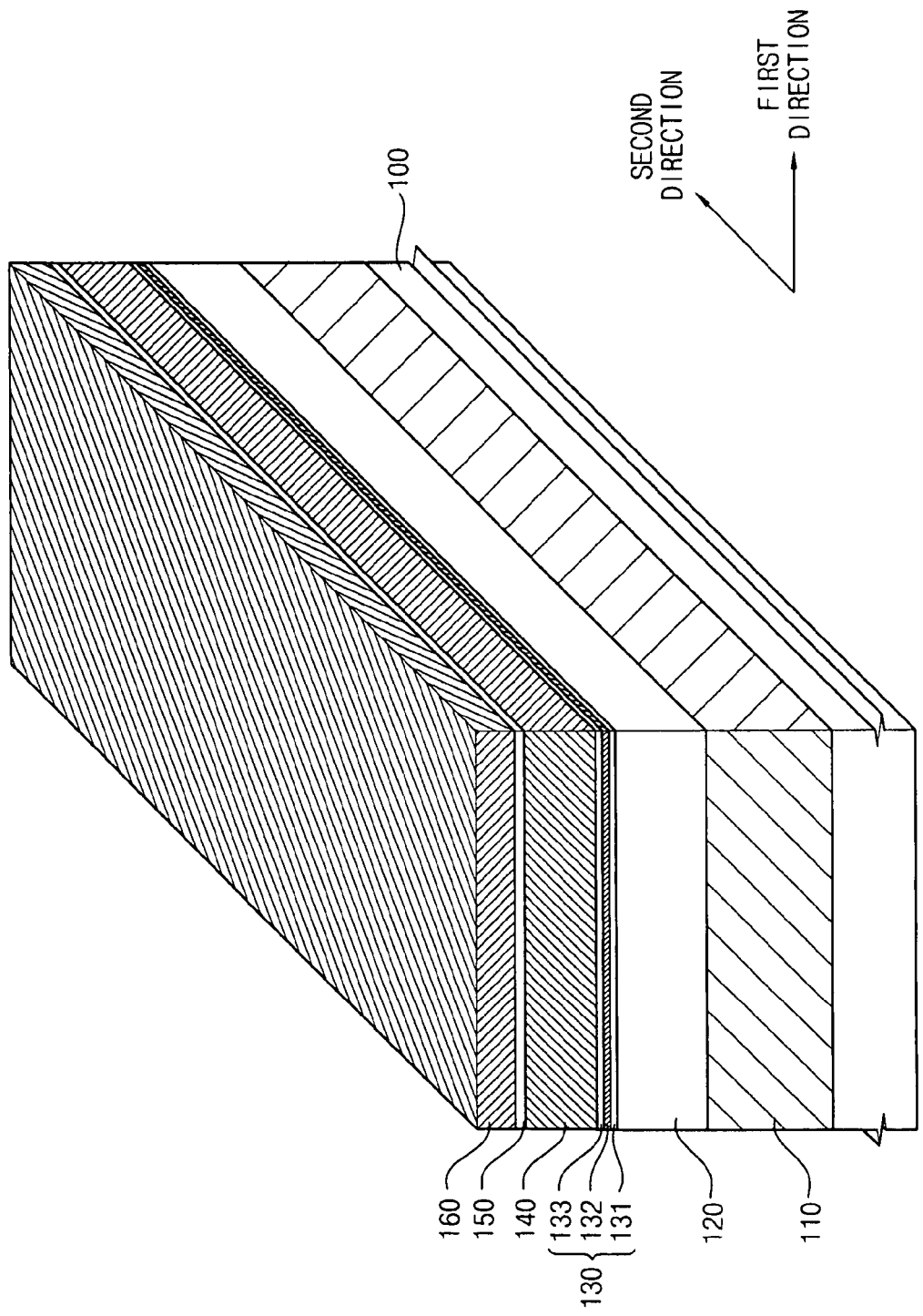

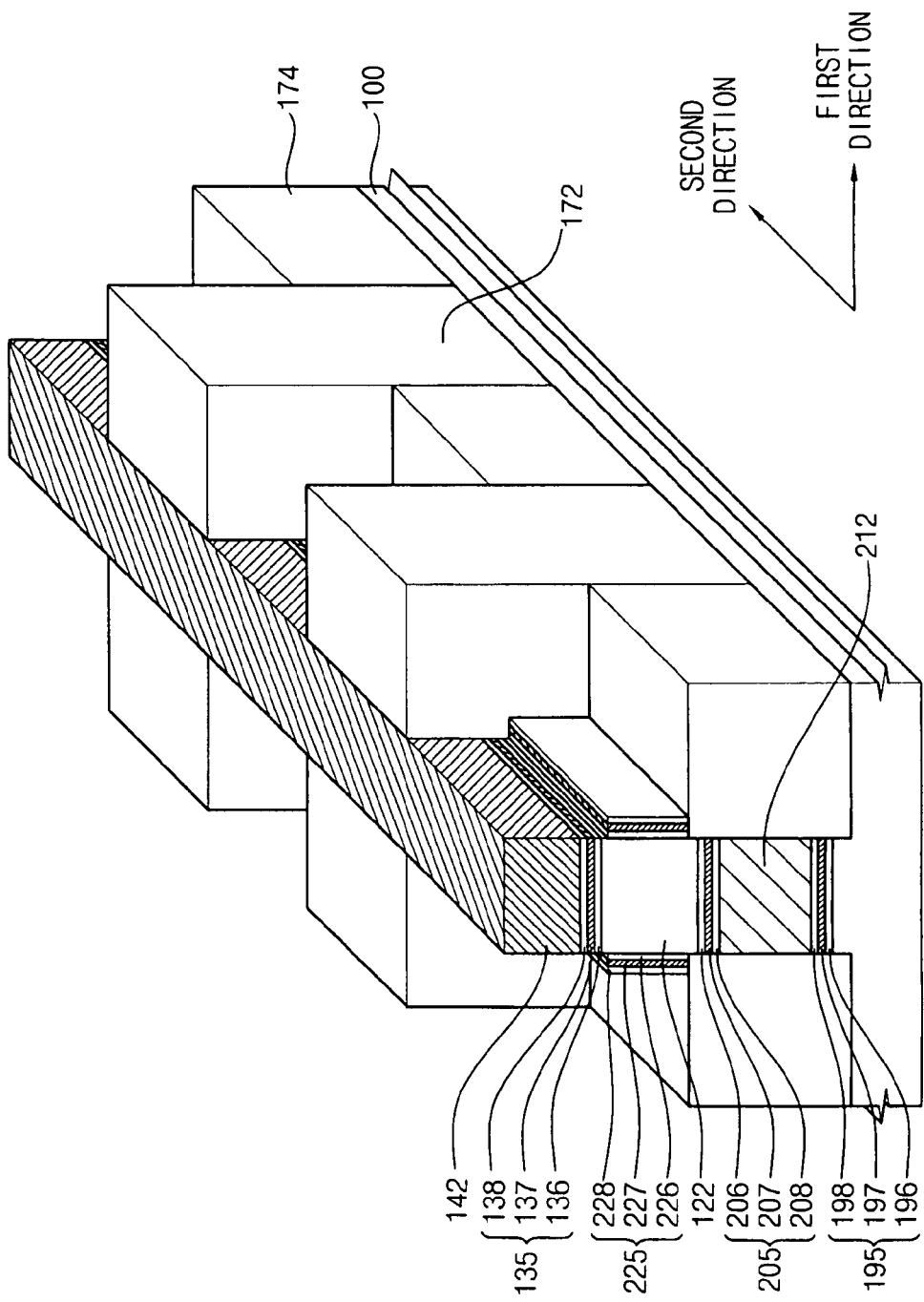

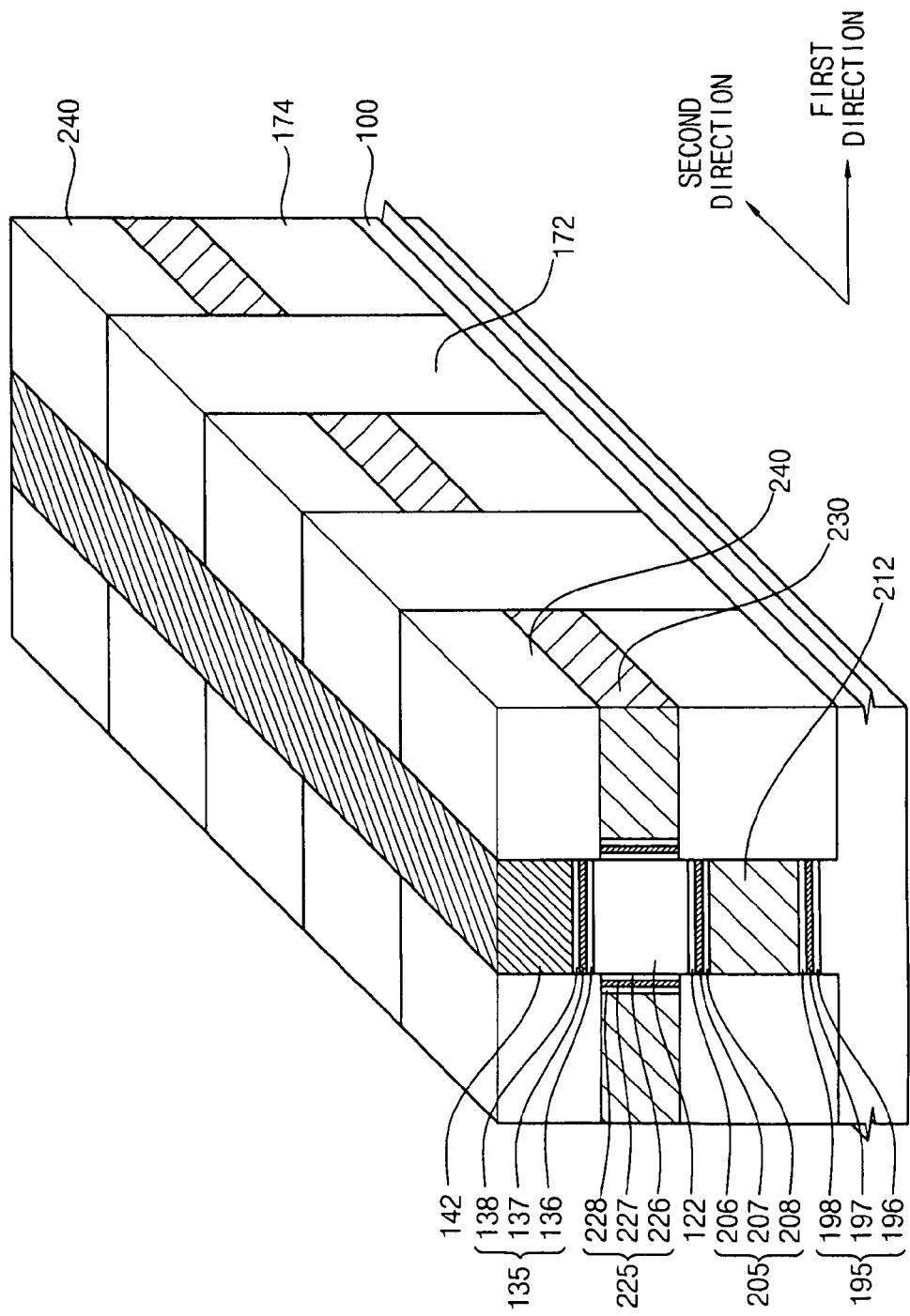

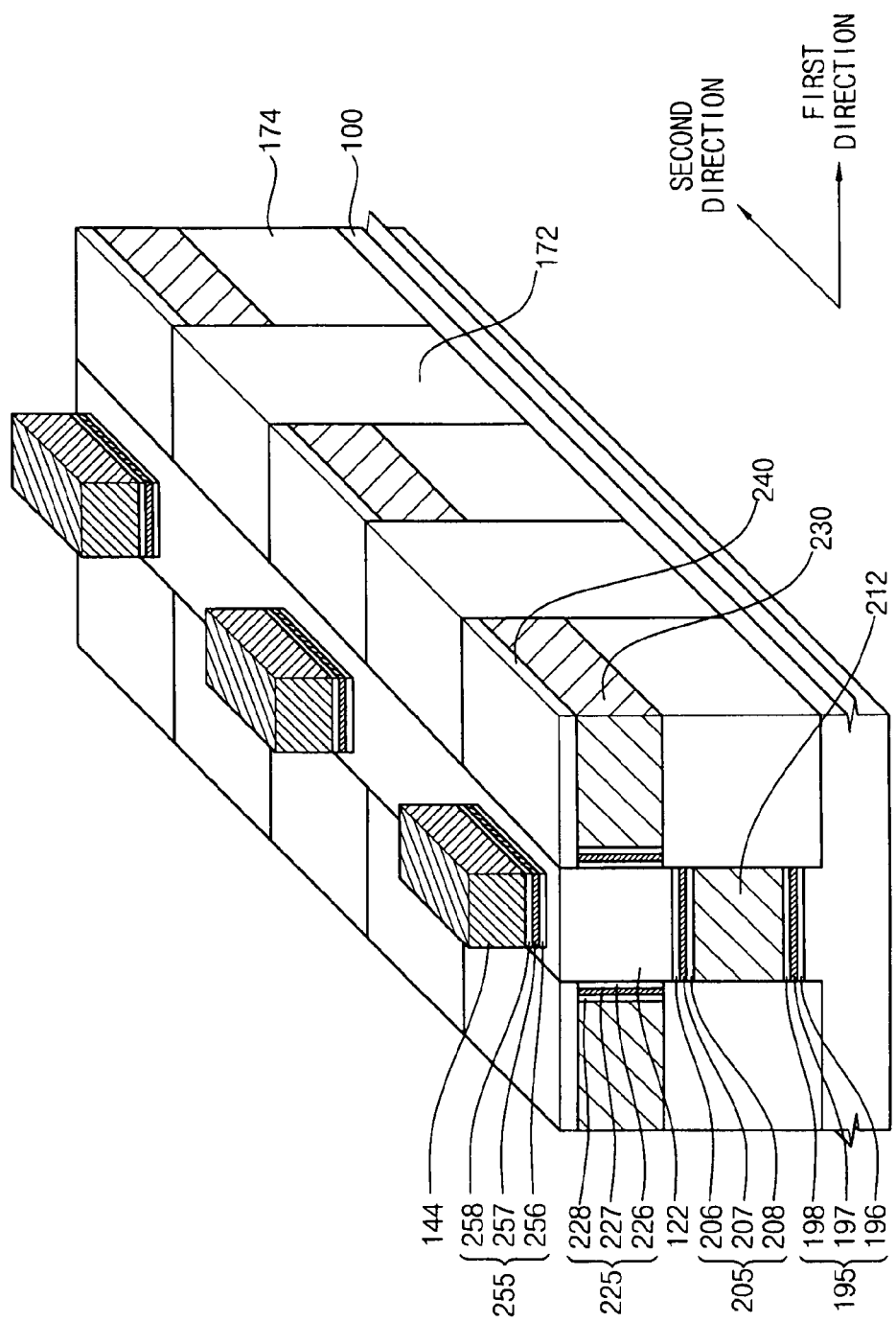

MEMORY DEVICE AND METHOD OF MANUFACTURING THE SAME

CROSS-REFERENCE TO RELATED APPLICATIONS

This application is a divisional of application Ser. No. 11/652,552 filed Jan. 12, 2007 now U.S. Pat. No. 7,535,051, which claims priority under 35 USC §119 to Korean Patent Application No. 2006-102190 filed on Oct. 20, 2006, the contents of each of which are herein incorporated by reference in their entirety for all purposes.

BACKGROUND

1. Field

Example embodiments relate to memory devices and methods of manufacturing the same. Example embodiments may relate, for example, to memory devices having improved integration and methods of manufacturing the same.

2. Description of the Related Art

Semiconductor memory devices may be classified into volatile memory devices such as dynamic random access memory (DRAM) devices or static random access memory (SRAM) devices, in which input/output operations of data may be performed relatively fast but data may be lost as time elapses, and non-volatile memory devices such as read only memory (ROM) devices, in which input/output operations of data may be performed relatively slow but data may be permanently stored.

Recently, demand for electrically erasable programmable read only memory (EEPROM) devices or flash memory devices, which are types of non-volatile memory devices, have increased. Flash memory devices may electrically perform programming and erasing operations using a Fowler-Nordheim (FN) tunneling and/or channel hot electron injection (CHEI) methods. The flash memory devices may be classified into floating gate type memory devices and floating trap type memory devices such as silicon-oxide-nitride-oxide-silicon (SONOS) devices or metal-oxide-nitride-oxide-semiconductor (MONOS) devices.

The floating trap type memory device may include a charge trapping layer and a gate electrode on a semiconductor substrate. The charge trapping layer may have a tunnel insulation layer, a charge storing layer that stores charges moving through a channel region, and/or a blocking layer on the semiconductor substrate.

A unit cell of the floating trap type memory device may serve as a single-level cell (SLC) or a multi-level cell (MLC). If the unit cell of the floating trap type memory device serves as an SLC, a logic value of "0" or "1" may be stored in a charge trapping layer, whereas if the unit cell of the floating trap type memory device serves as an MLC, a logic value of "00," "01," "10," or "11" may be stored in the charge trapping layer.

Recently, attempts have been made to comply with demand for increased integration of semiconductor memory devices. However, conventional methods to increase integration of semiconductor memory devices by decreasing the size of unit members of the semiconductor memory devices (hereinafter "scale-down methods") have been difficult due to technical limits of performing a photolithographical process and degradation of the unit members generated by a short channel effect. Although methods of increasing integration outside of decreasing the size of the unit members have been studied, integration of the semiconductor memory devices has not been sufficient and remains an essential subject for development.

SUMMARY

Example embodiments may provide memory devices having improved integration, wherein unit members of the memory devices may not scaled down.

Example embodiments may provide methods of manufacturing memory devices with improved integration, wherein unit members composing the memory devices may not be scaled down.

An example embodiment may be a memory device that may include an active pattern, a first charge trapping layer pattern, a first gate electrode, a second charge trapping layer pattern, a second gate electrode and/or a source/drain region. The active pattern may be formed on a semiconductor substrate. The first charge trapping layer pattern may be formed on the active pattern. The first gate electrode may extend on the first charge trapping layer pattern on a sidewall of the active pattern in a first direction. The second gate electrode may be formed on the second charge trapping layer pattern, extending in the first direction. The source/drain region may be formed in the active pattern.

In an example embodiment, the first charge trapping layer pattern may include a first tunnel insulation layer pattern, a first charge storing layer pattern, and/or a first blocking layer pattern on the semiconductor substrate. The second charge trapping layer pattern may include a second tunnel insulation layer pattern, a second charge storing layer pattern, and/or a second blocking layer pattern on a sidewall of the active pattern in the first direction.

In an example embodiment, a first pair of the second charge trapping layer pattern and a second gate electrode may be formed on a first sidewall of the active pattern in the first direction, and a second pair of the second charge trapping layer pattern and the second gate electrode may be formed on a second sidewall of the active pattern in a direction substantially opposite to the first direction.

An example embodiment may include a third gate electrode on the substrate and a third charge trapping layer pattern stacked between the third gate electrode and the active pattern.

In an example embodiment, the third charge trapping layer pattern may include a third blocking layer pattern, a third charge storing layer pattern, and/or a third tunnel insulation layer pattern formed on the third gate electrode.

In an example embodiment, the first, second and third tunnel insulation layer patterns and the first, second and third blocking layer patterns may include an oxide, and the first, second and third charge storing layer patterns may include a nitride or polysilicon.

In an example embodiment, the memory device may include a spacer covering a sidewall of the first gate electrode on the active pattern.

In an example embodiment, each of the first gate electrode, the first charge trapping layer pattern, the second gate electrode, and/or the second charge trapping layer pattern may be formed in plural numbers in a second direction substantially perpendicular to the first direction. The active pattern may have a linear shape and may extend in the second direction. The first gate electrodes, the first charge trapping layer patterns, the second gate electrodes, the second charge trapping layer patterns, and/or the active pattern may form a memory cell column. A plurality of the memory cell columns may be aligned in the first direction to form a memory cell array.

In an example embodiment, the source/drain region may be formed in a portion of the active pattern that is not covered by the first gate electrodes and the spacer.

In an example embodiment, the memory device may include a plurality of bit lines formed on the source/drain region, each of which may extend in the first direction.

In an example embodiment, each of the memory cell columns may include a first word line electrically connected to the first gate electrodes and extending in the second direction and/or a second word line electrically connected to the second gate electrodes and extending in the second direction.

An example embodiment may provide a method of manufacturing a memory device. In an example embodiment method of manufacturing the memory device, an active pattern, a preliminary first charge trapping layer pattern and/or a preliminary first gate electrode may be formed on a semiconductor substrate. A second charge trapping layer pattern may be formed on a sidewall of the active pattern extending in a first direction. A second gate electrode may be formed on the second charge trapping layer pattern extending in the first direction. A first charge trapping layer pattern and a first gate electrode may be formed on the active pattern by partially removing the preliminary first gate electrode and the preliminary first charge trapping layer pattern. A source/drain region may be formed in the active pattern.

In an example embodiment, if the preliminary first charge trapping layer pattern is formed, a preliminary first tunnel insulation layer pattern may be formed on the active pattern. A preliminary first charge storing layer pattern may be formed on the preliminary first tunnel insulation layer. A preliminary first blocking layer pattern may be formed on the preliminary first charge storing layer pattern.

In an example embodiment, if the second charge trapping layer pattern is formed, a second tunnel insulation layer may be formed by oxidizing a surface portion of the active pattern. A second charge storing layer may be on the semiconductor substrate to cover the second tunnel insulation layer. A second tunnel insulation layer pattern and a second charge storing layer pattern may be sequentially formed on a sidewall of the active pattern in the first direction by partially removing the second charge storing layer and the second tunnel insulation layer. A second blocking layer may be formed on the semiconductor substrate to cover the second tunnel insulation layer pattern and the second charge storing layer pattern. A second blocking layer pattern may be formed on the second charge storing layer pattern in the first direction by partially removing the second blocking layer.

In an example embodiment, the second charge storing layer may be formed using a nitride, polysilicon, and/or another suitable material, and the second blocking layer may be formed using an oxide or the like.

In an example embodiment, the second charge storing layer, the second tunnel insulation layer and/or the second blocking layer may be partially removed by an isotropic etching process or any other suitable process.

In an example embodiment, after forming the first gate electrode, a spacer may be formed on the active pattern and may cover a sidewall of the first gate electrode.

Example embodiments may provide a method of manufacturing a memory device. In an example embodiment method of manufacturing the memory device, a sacrificial layer pattern, an active pattern, a preliminary charge trapping layer pattern, and/or a preliminary first gate electrode may be formed on a semiconductor substrate. A first space exposing a top surface of the semiconductor substrate and a bottom surface of the active pattern may be formed. A second charge trapping layer pattern and a second gate electrode may be formed to occupy the first space. A third charge trapping layer pattern may be formed on a sidewall of the active pattern in a first direction. A third gate electrode may be formed on the third charge trapping layer pattern in the first direction. A first charge trapping layer pattern and a first gate electrode may be formed on the active pattern by partially removing the preliminary first gate electrode and the preliminary first charge trapping layer pattern. A source/drain region may be formed in the active pattern.

In an example embodiment, prior to forming the sacrificial layer pattern, a first insulation layer may be formed on the semiconductor substrate to cover the sacrificial layer pattern, the active pattern, the preliminary first charge trapping layer pattern, and/or the preliminary first gate electrode. The first insulation layer may be planarized and a top surface of the preliminary first gate electrode may be exposed. A first insulation layer pattern partially exposing sidewalls of the sacrificial layer pattern, the active pattern, the preliminary first charge trapping layer pattern, and/or the preliminary first gate electrode may be formed by partially removing the first insulation layer.

In an example embodiment, if the preliminary first charge trapping layer pattern is formed, a preliminary first tunnel insulation layer pattern may be formed on the active pattern. A preliminary first charge storing layer pattern may be formed on the preliminary first tunnel insulation layer pattern. A preliminary first blocking layer pattern may be formed on the preliminary first charge storing layer pattern.

In an example embodiment, if the second charge trapping layer pattern and the second gate electrode are formed, a second tunnel insulation layer pattern may be formed on the bottom surface of the active pattern. A second charge storing layer pattern may be formed on the second tunnel insulation layer. A second blocking layer pattern may be formed on the second charge storing layer pattern. The second gate electrode may be formed on the second blocking layer pattern.

In an example embodiment, the second tunnel insulation layer pattern and the second blocking layer pattern may be formed using an oxide, and the second charge storing layer pattern may be formed using a nitride, polysilicon, or any suitable material.

In an example embodiment, while forming the second charge trapping layer pattern, a fourth charge trapping layer pattern including a fourth tunnel insulation layer, a fourth charge storing layer pattern, and a fourth blocking layer pattern may be further formed on the semiconductor substrate.

In an example embodiment, if the second charge trapping layer pattern and the second gate electrode are formed, a second tunnel insulation layer and a fourth tunnel insulation layer may be formed by oxidizing a surface of the active pattern and the semiconductor substrate. A second charge storing layer may be formed to cover the second tunnel insulation layer, and a fourth charge storing layer may be formed to cover the fourth tunnel insulation layer. A second space may be formed between the second and the fourth charge storing layers. The second tunnel insulation layer pattern, the second charge storing layer pattern, the fourth tunnel insulation layer pattern, and the fourth charge storing layer pattern may be formed by partially removing the second and fourth charge storing layers and the second and fourth tunnel insulation layers. The second tunnel insulation layer pattern and the second charge storing layer pattern may be formed on the bottom surface of the active pattern, and the fourth tunnel insulation layer pattern and the fourth charge storing layer pattern may be formed on the top surface of the semiconductor substrate. A second blocking layer may be formed to cover the second charge storing layer pattern and the second tunnel insulation layer, and a fourth blocking layer may be formed to cover the fourth charge storing layer pattern and the fourth tunnel insulation layer. A third space may be formed between the second and the fourth blocking layers. A second blocking layer pattern may be formed on the second charge storing layer pattern, and a fourth blocking layer pattern may be formed on the fourth charge storing layer pattern by partially removing the second and the fourth blocking layers. A conductive layer may be formed on the semiconductor substrate to occupy the third space. The second gate electrode may be formed between the second and the fourth blocking layer patterns by partially removing the conductive layer.

In an example embodiment, prior to forming the third charge trapping layer pattern, a second insulation layer pattern may be formed on the semiconductor substrate to partially cover the sacrificial layer pattern, the second gate electrode, the second charge trapping layer pattern, and/or the active pattern. The third charge trapping layer pattern and the third gate electrode may be formed on the second insulation layer pattern.

In an example embodiment, after forming the first gate electrode, a spacer may be formed on the active pattern to cover a sidewall of the first gate electrode.

Example embodiments may provide a memory device that may include four charge trapping layer patterns, each of which is formed on a top surface, a bottom surface, a right sidewall, and/or a left sidewall of the active pattern. The memory device may have improved integration without decreasing the size of unit members within the memory device.

BRIEF DESCRIPTION OF THE DRAWINGS

The above and other features and advantages of example embodiments will become more apparent by describing them in detailed with reference to the accompanying drawings, in which.

DETAILED DESCRIPTION

Figure 1A:
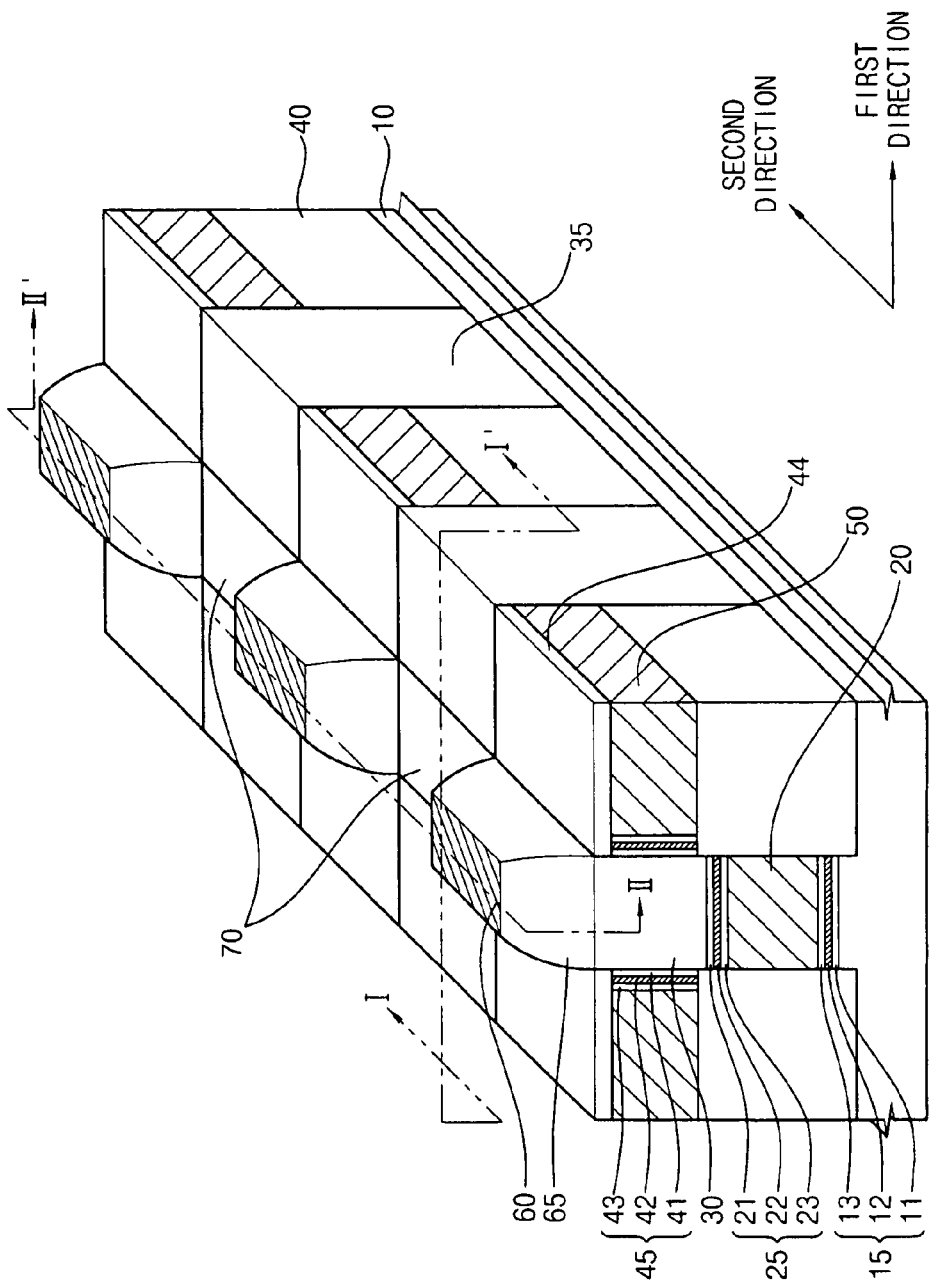
FIG. 1A is a perspective view illustrating an example embodiment memory device.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

Figure 1B:
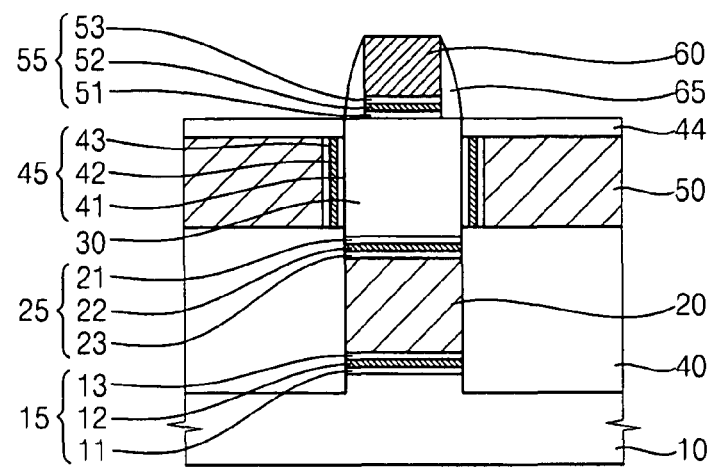
FIG. 1B is a cross-sectional view illustrating the example embodiment memory device taken along a line I-I' in FIG. 1A.
Figure 1C:
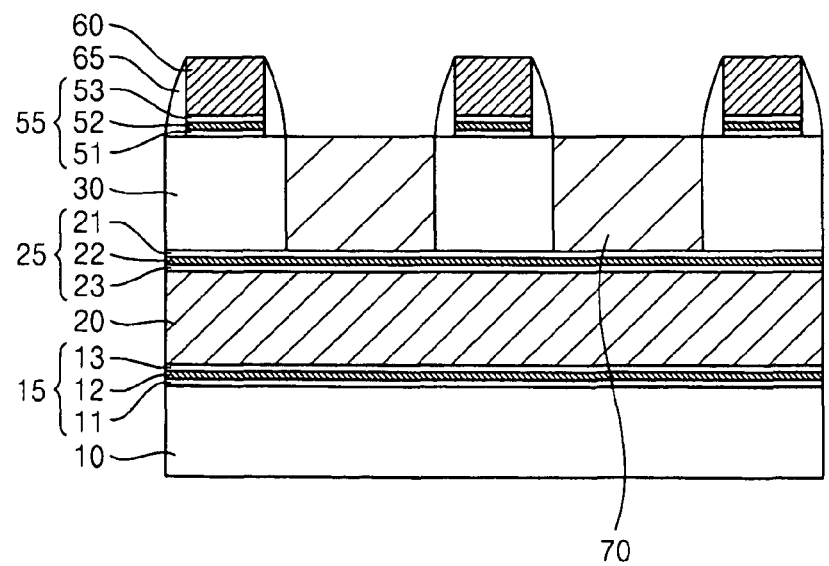
FIG. 1C is a cross-sectional view illustrating the example embodiment memory device taken along a line II-II' in FIG. 1A.

FIG. 1A is a perspective view illustrating an example embodiment memory device; FIG. 1B is a cross-sectional view illustrating the example embodiment memory device taken along a line I-I' in FIG. 1A; and FIG. 1C is a cross-sectional view illustrating the example embodiment memory device taken along a line II-II' in FIG. 1A. FIGS. 1A to 1C may illustrate floating trap type memory devices, but the description of these figures is equally applicable to floating gate type memory devices or volatile memory devices such as DRAM devices.

As shown in FIGS. 1A to 1C, a memory device may include a first charge trapping layer pattern 15, a first gate electrode 20, a second charge trapping layer pattern 25, an active pattern 30, a third charge trapping layer pattern 45, a second gate electrode 50, a fourth charge trapping layer pattern 55, and/or a third gate electrode 60 on a semiconductor substrate 10.

The memory device may include a first insulation layer pattern 35 and a second insulation layer pattern 40 formed on the semiconductor substrate 10, and/or a third insulation layer pattern 44 formed on the second gate electrode 50. A spacer may be formed on sidewalls of the third gate electrode 60 and the fourth charge trapping layer pattern 55.

The first charge trapping layer pattern 15, the first gate electrode 20, the second charge trapping layer pattern 25, the active pattern 30, and/or the third gate electrode 60 may be stacked on a surface of the semiconductor substrate 10. The third charge trapping layer pattern 45 and the second gate electrode 50 may be stacked against the sidewalls of the active pattern 30 in a first direction.

The second insulation layer pattern 40 may be formed between the semiconductor substrate 10 and a stack of the second gate electrode 50 and the third charge trapping layer pattern 45.

In an example embodiment, the first and the second charge trapping layer patterns 15 and 25, the first gate electrode 20, and/or the active pattern 30 may be formed on a portion of the substrate and may extend in a second direction substantially perpendicular to the first direction. A plurality of second gate electrodes 50, a plurality of third gate electrodes 60, a plurality of third charge trapping layer patterns 45, and/or a plurality of fourth charge trapping layer patterns 55 may be formed. Each of the second gate electrodes 50, each of the third gate electrodes 60, each of the third charge trapping layer patterns 45, and/or each of the fourth charge trapping layer patterns 55 may extend in the second direction apart from one another. A plurality of second insulation layer patterns 40 and a plurality of third insulation layer patterns 44 may extend in the second direction apart one another. A plurality of first insulation layer patterns 35 may be between second structures formed by the second insulation layer pattern 40, the second gate electrode 50, the third insulation layer patterns 44, and/or the third charge trapping layer patterns 45.

Each of the first, second, third and fourth charge trapping layer patterns 15, 25, 45 and 55 may include a tunnel insulation layer pattern, a charge storing layer pattern and/or a blocking layer pattern. The first charge trapping layer pattern 15 may include a first tunnel insulation layer pattern 11, a first charge storing layer pattern 12, and/or a first blocking layer pattern 13, and the second charge trapping layer pattern 25 may include a second tunnel insulation layer pattern 21, a second charge storing layer pattern 22, and/or a second blocking layer pattern 23. The third charge trapping layer pattern 45 may include a third tunnel insulation layer pattern 41, a third charge storing layer pattern 42, and/or a third blocking layer pattern 43, and the fourth charge trapping layer pattern 55 may include a fourth tunnel insulation layer pattern 51, a fourth charge storing layer pattern 52, and/or a fourth blocking layer pattern 53.

Each of the first, second, third, and/or fourth tunnel insulation layer patterns 11, 21, 41, and 51 may include an oxide, for example, silicon oxide or any other oxide. The second, third, and/or fourth tunnel insulation layer patterns 21, 41, and 51 may electrically insulate the active pattern 30 from the second, third, and/or fourth charge storing layer patterns 22, 42 and 52.

The first, second, third, and/or fourth charge storing layer patterns 12, 22, 42, and 52 may include polysilicon and/or a nitride, for example, silicon nitride and/or any other nitride. The second, third, and/or fourth charge storing layer patterns 22, 42 and 52 may store charges trapped by the second, third, and/or fourth charge trapping layer patterns 25, 45 and 55 from a channel region in the active pattern 30.

The first, second, third, and/or fourth blocking layer patterns 13, 23, 43, and 53 may include an oxide, for example, metal oxide, silicon oxide, and/or any other oxide. The second, third, and/or fourth blocking layer patterns 23, 43 and 53 may electrically insulate the first, second, and/or third gate electrodes 20, 50 and 60 from the second, third, and/or fourth charge storing layer patterns 22, 42, and 52.

The first charge trapping layer pattern 15 may be formed while the second charge trapping layer pattern 25 is formed and may not need to trap charges from the channel region in the active pattern 30. The first charge trapping layer pattern 15 may not have each of the first tunnel insulation layer pattern 11, the first charge storing layer pattern 12, and the first blocking layer pattern 13. The first charge trapping layer pattern 15 may instead include any insulating material that electrically insulates the first gate electrode 20 from the semiconductor substrate 10.

The first, second, and/or third gate electrodes 20, 50 and 60 may include polysilicon, metal, metal silicide, or the like. The spacer 65 may include a nitride, for example, silicon nitride and/or any nitride.

The active pattern 30 may include silicon, for example, single crystalline silicon and/or any other suitable type of silicon. A plurality of source/drain regions 70 may be formed in regions of the active pattern 30 that are not covered by the third gate electrodes 60 and the fourth charge trapping layer patterns 55. The source/drain regions 70 may include doped silicon or the like. The channel region may be formed in portions of the active pattern 30 between the source/drain regions 70.

The first, second, and/or third insulation layer patterns 35, 40, and 44 may include an oxide, for example, silicon oxide and/or any oxide. The first, second, and third insulation layer patterns 35, 40, and 44 may include substantially similar materials but each of them may also include distinct materials. The first, second, and third insulation layer patterns 35, 40, and 44 may serve as an isolation layer.

The example embodiment memory device may include the second, third, and fourth charge trapping layer patterns 25, 45, and 55, which may be formed on a top surface of the first gate electrode 20, a right and left sidewall of the active pattern 30, and a top surface of the active pattern 30, respectively. The example embodiment may store an 8- or 16-bit logic level in a unit cell, whereas a conventional memory device may store a 2- or 4-bit logic level. The example embodiment may have increased integration without decreasing the size of unit members forming the memory device.

Figure 2A:
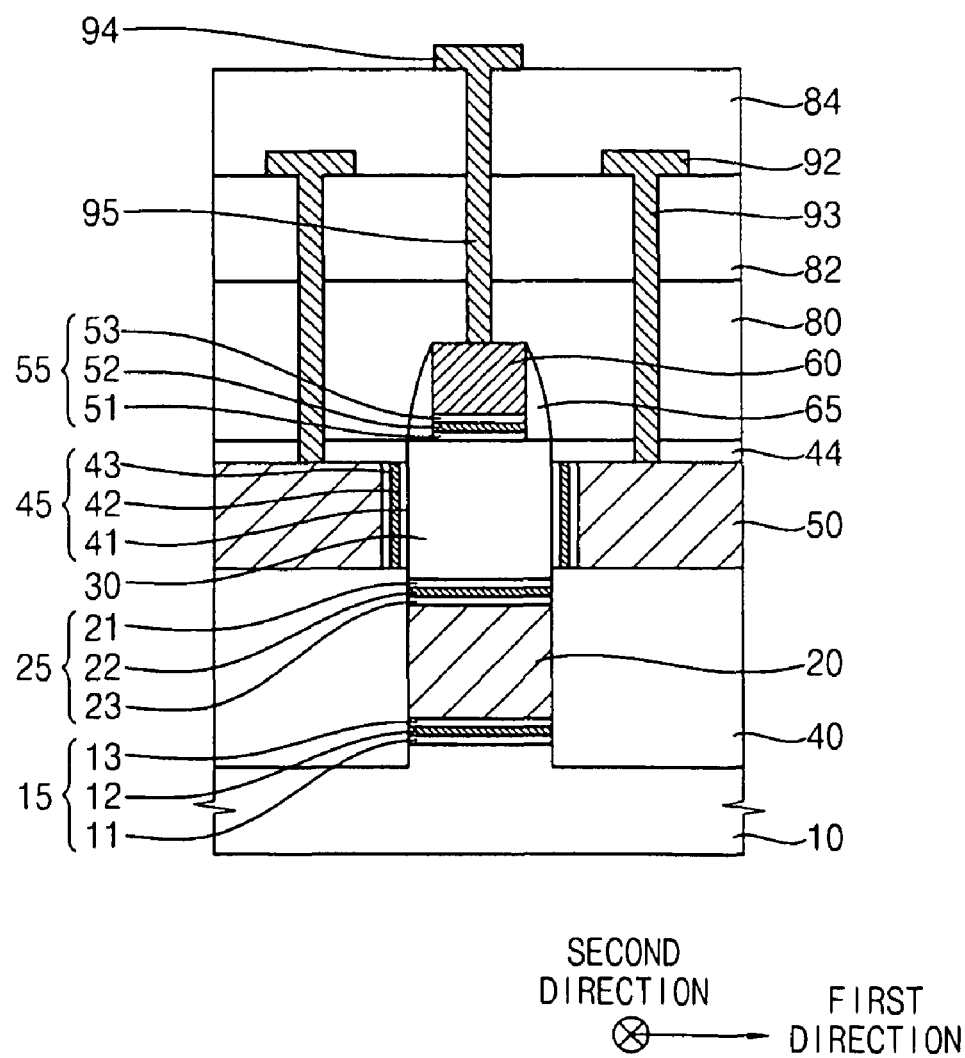
FIG. 2A is a cross-sectional view along a first direction illustrating a an example embodiment memory device including a bit line and a word line.
Figure 2B:
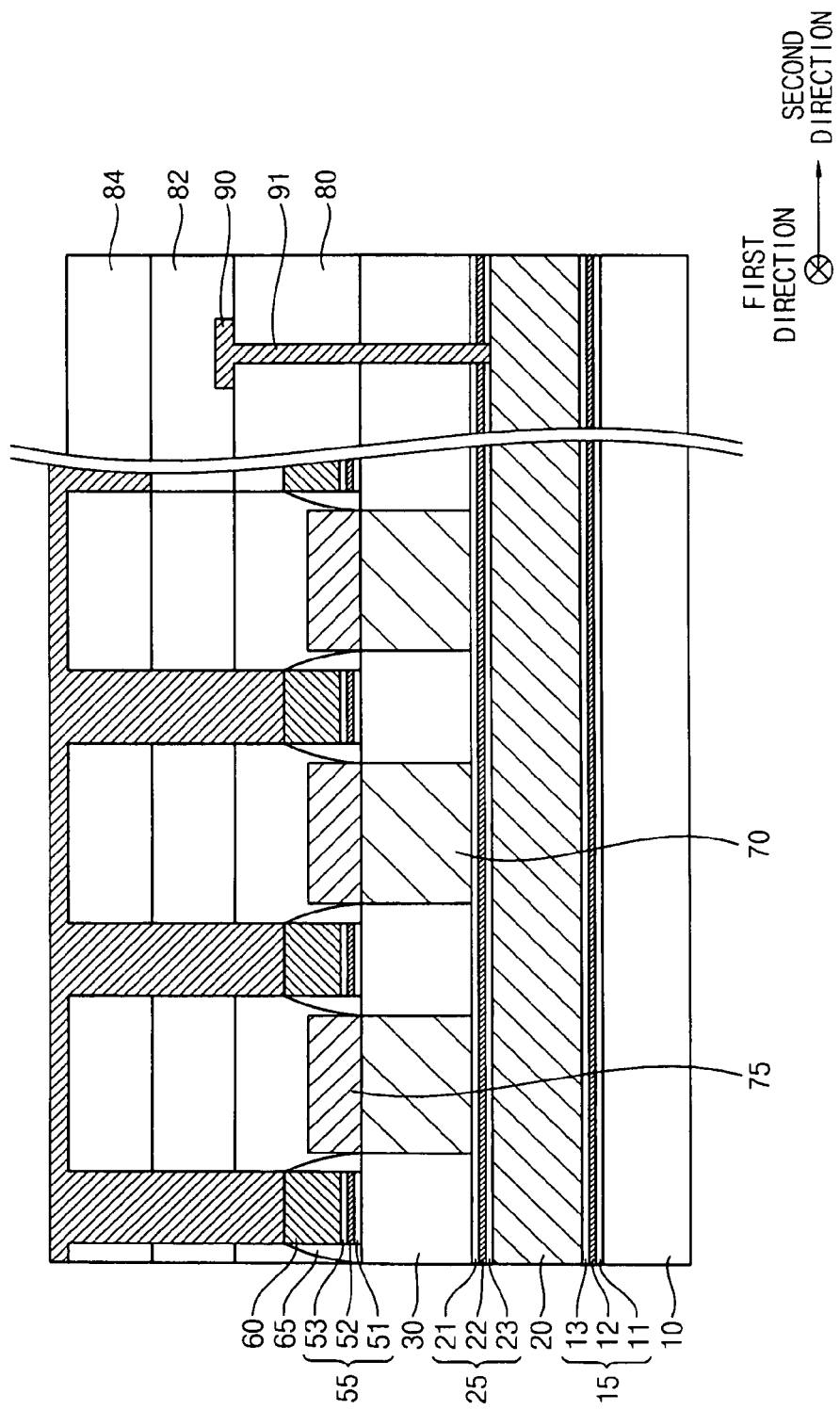
FIG. 2B is a cross-sectional view along a second direction that is substantially perpendicular to the first direction illustrating the example embodiment memory device.

FIG. 2A is a cross-sectional view taken along a first direction illustrating another example embodiment memory device that may include a bit line and a word line. FIG. 2B is a cross-sectional view taken along a second direction illustrating the example embodiment memory device.

As shown in FIGS. 2A and 2B, an example embodiment may include a bit line 75, a first word line 90, a first word line plug 91, a second word line 92, a second word line plug 93, a third word line 94, and/or a third word line plug 95. Example embodiments may include a fourth insulation layer 80, a fifth insulation layer 82, and/or a sixth insulation layer 84.

A plurality of bit lines 75 may be formed on the first insulation layer patterns 35 and/or the source/drain regions 70. Each of the bit lines 75 may extend in the first direction and may be sequentially placed apart from one another in the second direction. In an example embodiment, each of the bit lines 75 may reach a height lower than that of each of the third gate electrodes 60. The bit lines 75 may include a conductive material, for example, metal, metal silicide, a combination thereof, or the like.

The fourth insulation layer 80 may be formed on the first and the third insulation layer patterns 35 and 44 and on the active pattern 30, on which the third gate electrodes 60, the fourth charge trapping layer patterns 55, the spacers 65 and the bit lines 75 may be formed. The fourth insulation layer 80 may include substantially similar materials but may also include distinct materials from that of each of the first, second and third insulation layer patterns 35, 40, and 44.

As shown in FIG. 2B, the first word line 90 may be formed on the fourth insulation layer 80. The first word line plug 91 may make contact with the first gate electrode 20 to electrically connect the first word line 90 to the first gate electrode 20. In an example embodiment, only one first word line plug 91 may be formed in one of the memory cell columns that are placed sequentially in the second direction. The first word line plug 91 formed in one of the memory cell columns may make contact with a portion of the first gate electrode 20, which is an end portion of the first gate electrode 20 extending in the second direction. In an example embodiment, the first word line 90 may have an island shape unlike the second or the third word line 92 or 94, which may have a linear shape.

The fifth insulation layer 82 may be formed on the fourth insulation layer 80 to cover the first word line 90. The fifth insulation layer 82 may include substantially similar materials but may also include distinct materials from that of the fourth insulation layer 80.

The second word line 92 may be formed on the fifth insulation layer 82. The second word line plug 93 may make contact with the second gate electrode 50 to electrically connect the second word line 92 to the second gate electrode 50. In an example embodiment, a plurality of the second word line plugs 93 may be formed to make contact with a plurality of the second gate electrodes 50 that may extend in the second direction. The second word line 92 may have a linear shape and may extend in the second direction. In an example embodiment, two second word lines 92 may be formed in one of the memory cell columns, because two columns of the second gate electrodes 50, each of which may include a plurality of the second gate electrodes 50 extending in the second direction, may be formed in one of the memory cell columns in the first direction.

The sixth insulation layer 84 may be formed on the fifth insulation layer 82 to cover the second word line 92. The sixth insulation layer 84 may include substantially similar materials but may also include distinct materials from that of each of the fourth and the fifth insulation layers 80 and 82.

The third word line 94 may be formed on the sixth insulation layer 84. The third word line plug 95 may make contact with the third gate electrode 60 to electrically connect the third word line 94 to the third gate electrode 60. In an example embodiment, a plurality of the third word line plugs 95 may be formed to make contact with a plurality of the third gate electrodes 60. The third word line 94 may have a linear shape extending in the second direction. It is possible that only one third word line 94 may be formed in one of the memory cell columns.

In an example embodiment, the bit lines 75 may be directly connected to the source/drain regions 70 without bit line pads interposed therebetween.

The first gate electrode 20 may have a linear shape extending in the second direction so that only one first word line plug 91 may be needed in one of the memory cell columns and that the first word line 90 may not need to have a linear shape. The second word line 92 may have a linear shape so that the second gate electrodes 50 in one of the memory cell columns in the second direction may be connected to one another. The third word line 94 may have a linear shape so that the third gate electrodes 60 in one of the memory cell columns in the second direction may be connected to one another.

Figure 3A:
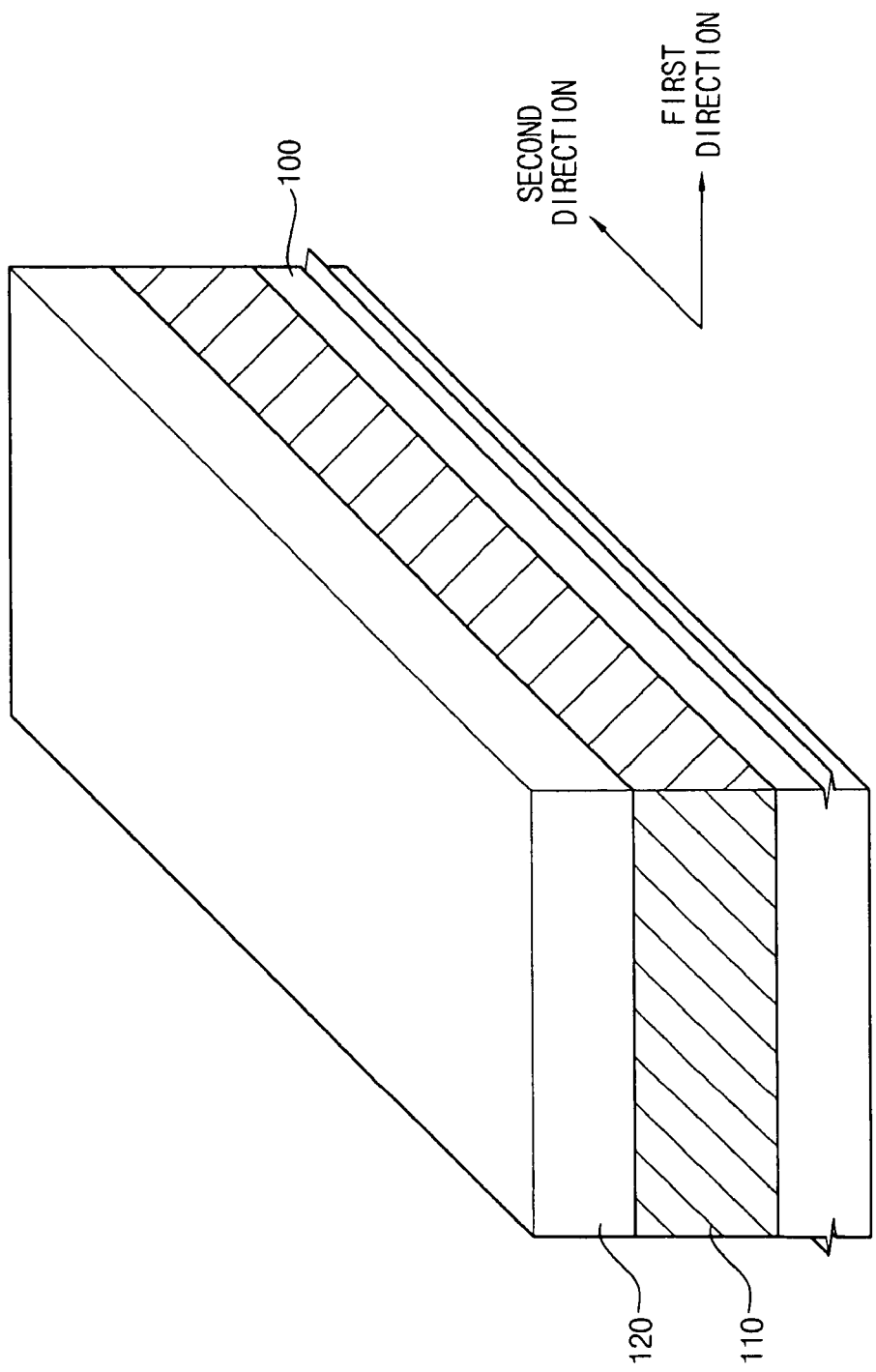
FIGS. 3A to 3P are perspective views illustrating an example embodiment method of manufacturing a memory device.
Figure 3D:
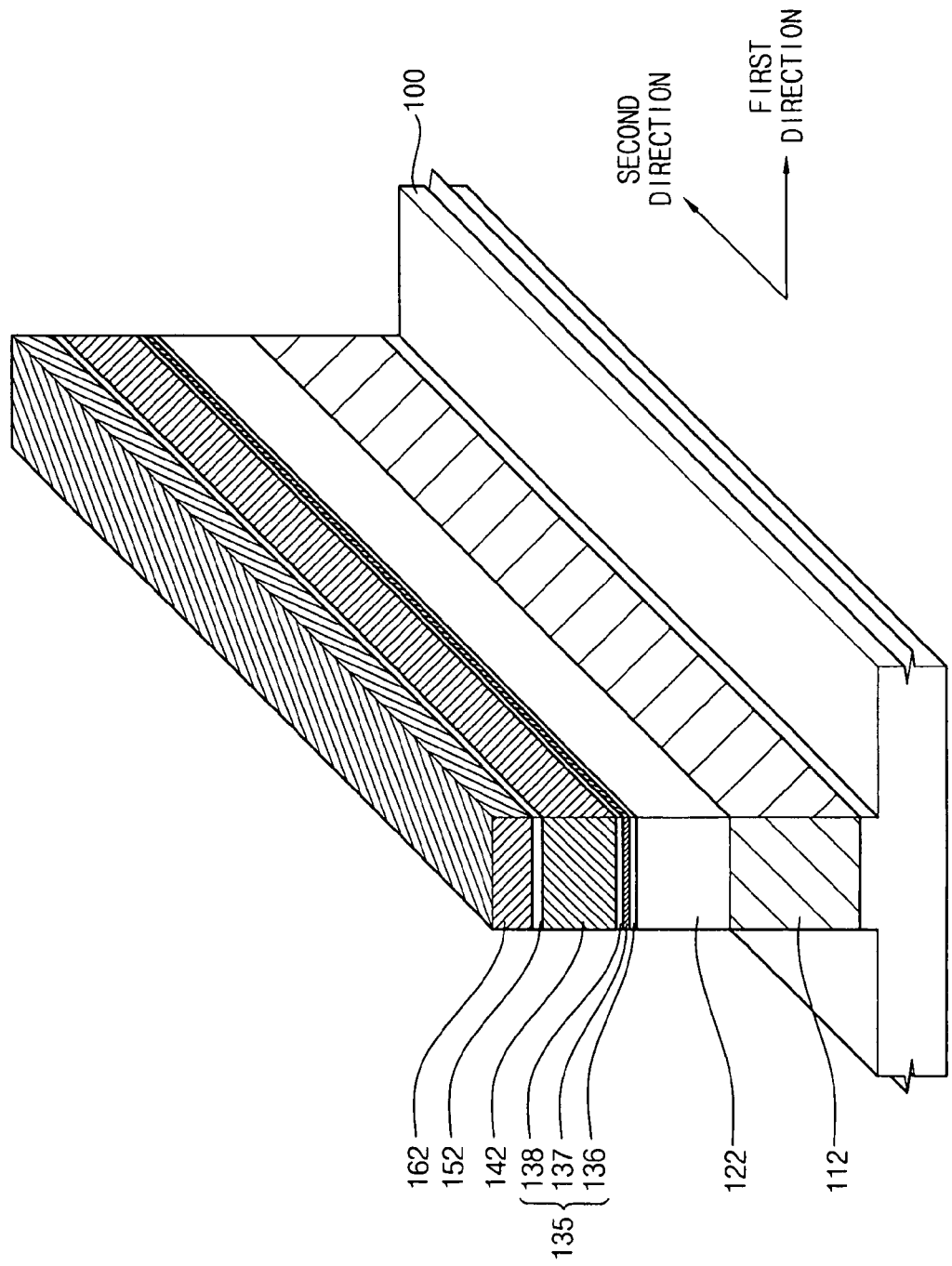
Figure 3E:
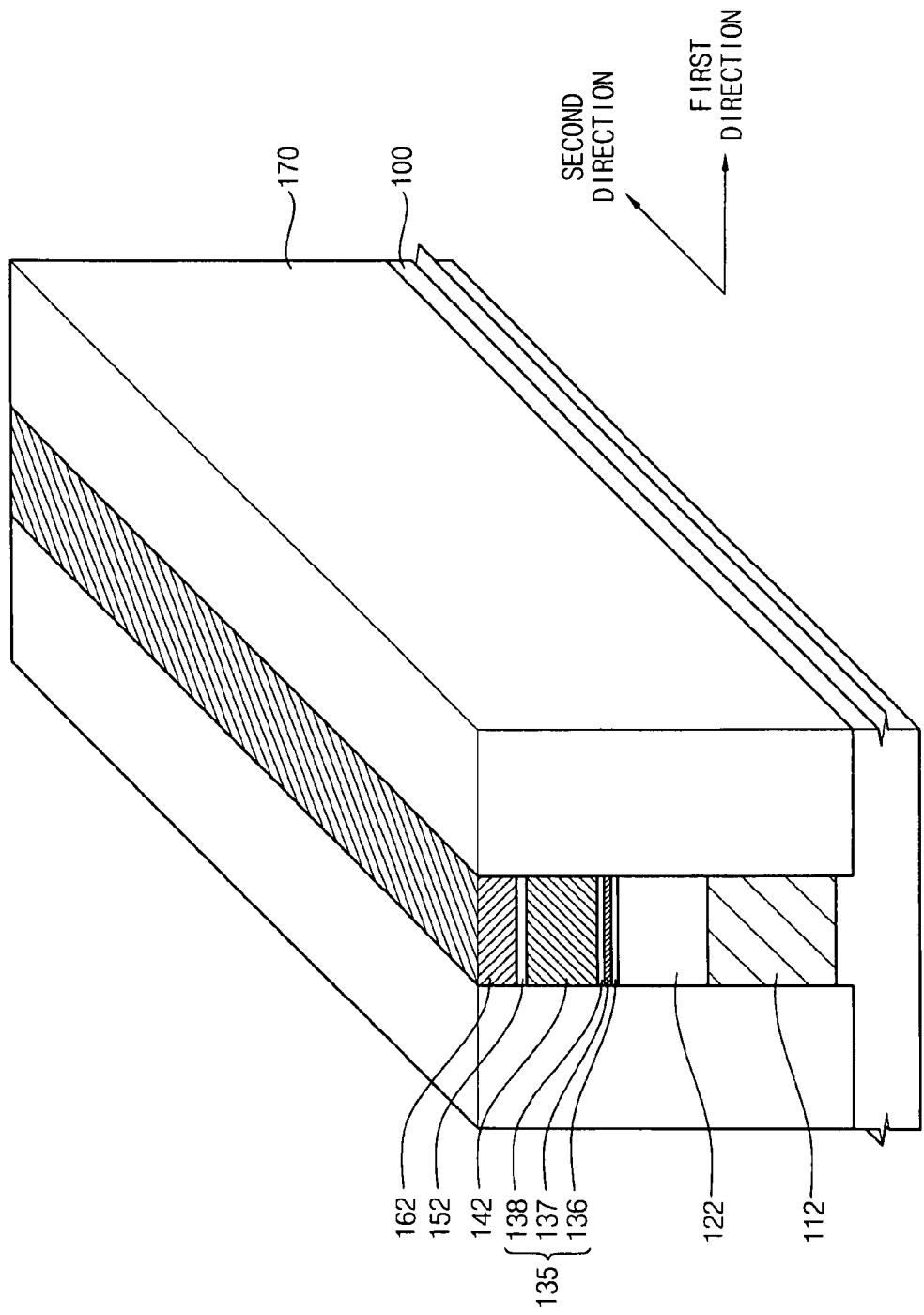
Figure 3F:
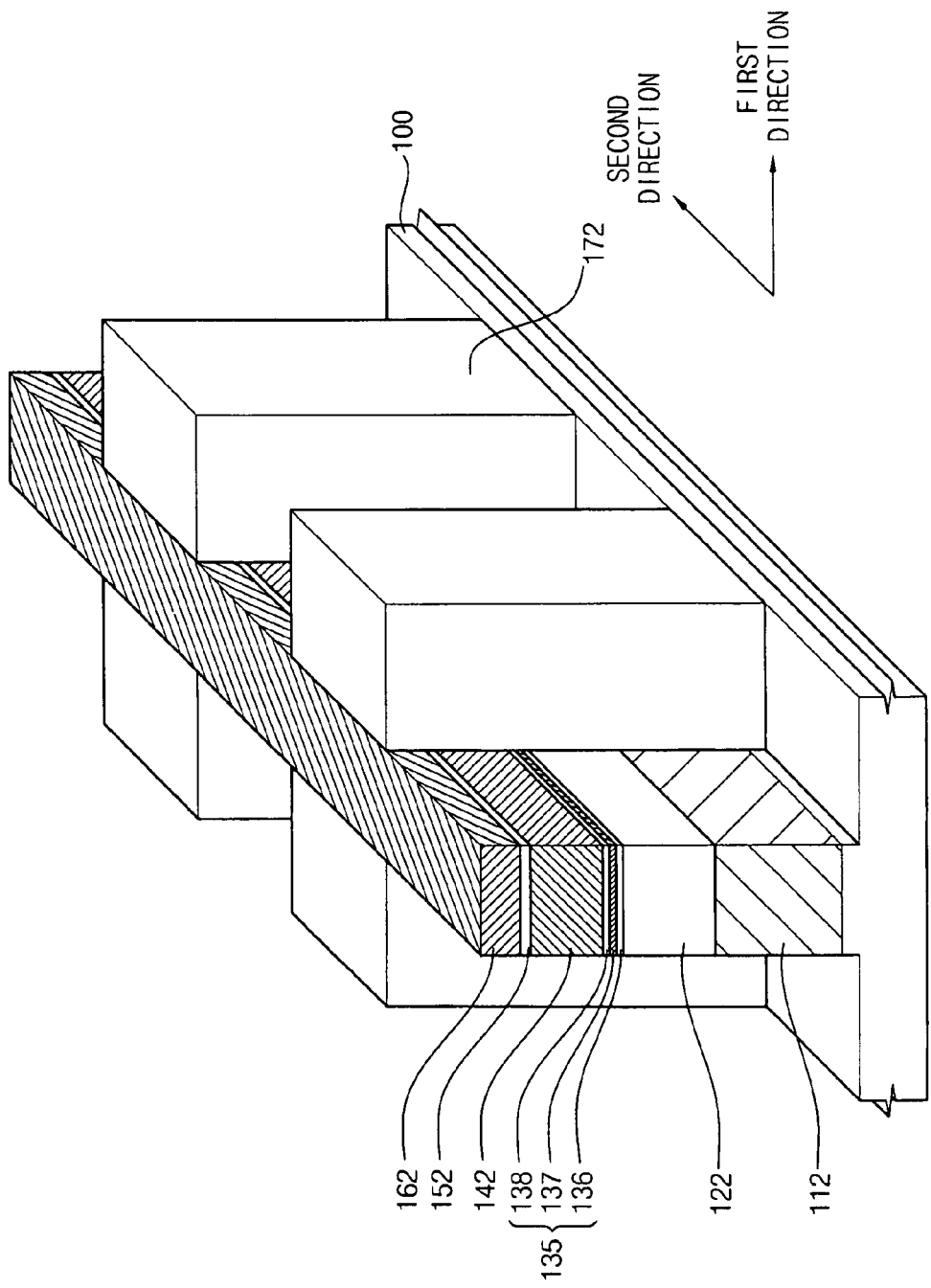
Figure 3G:
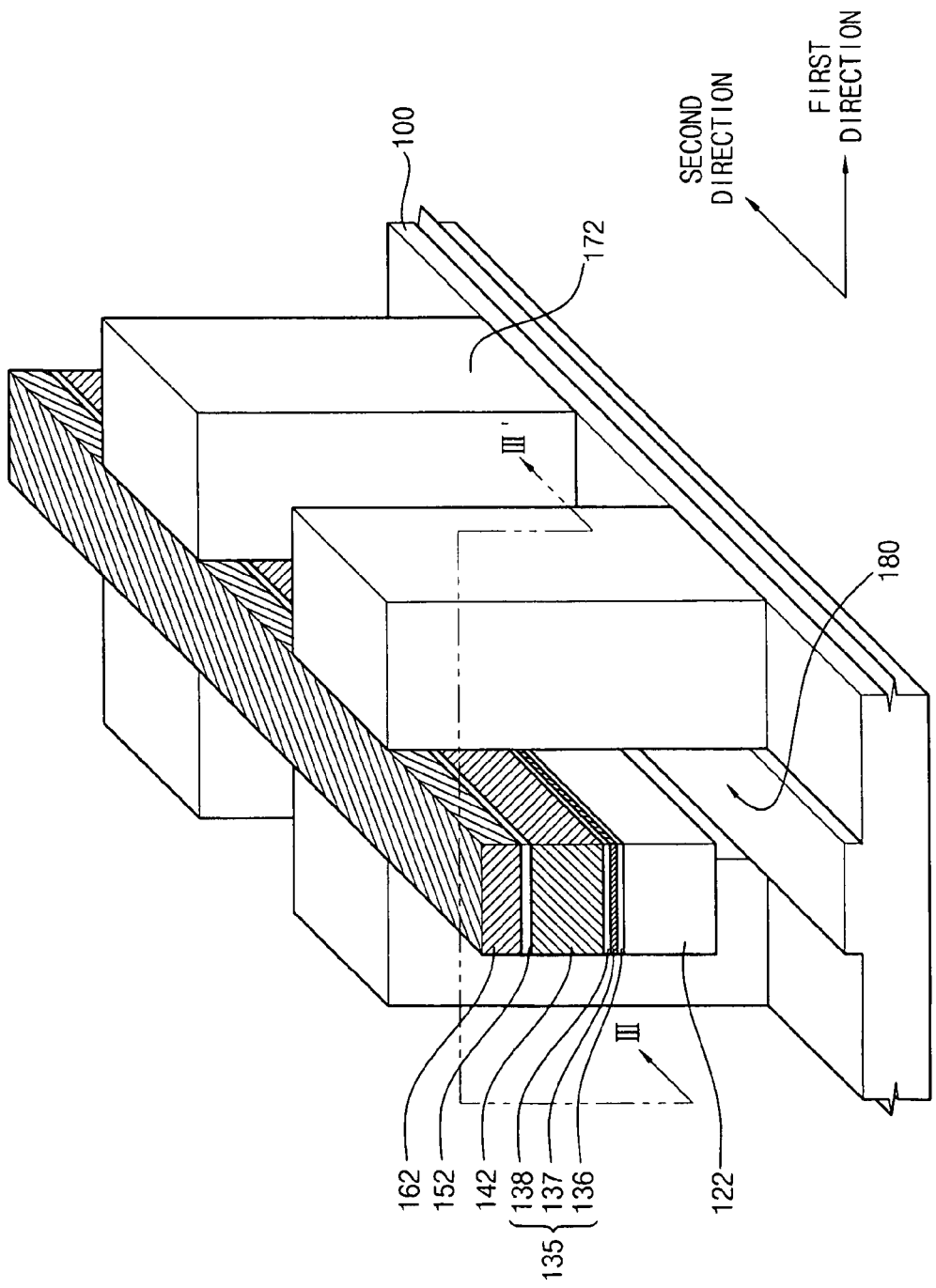
Figure 3H:
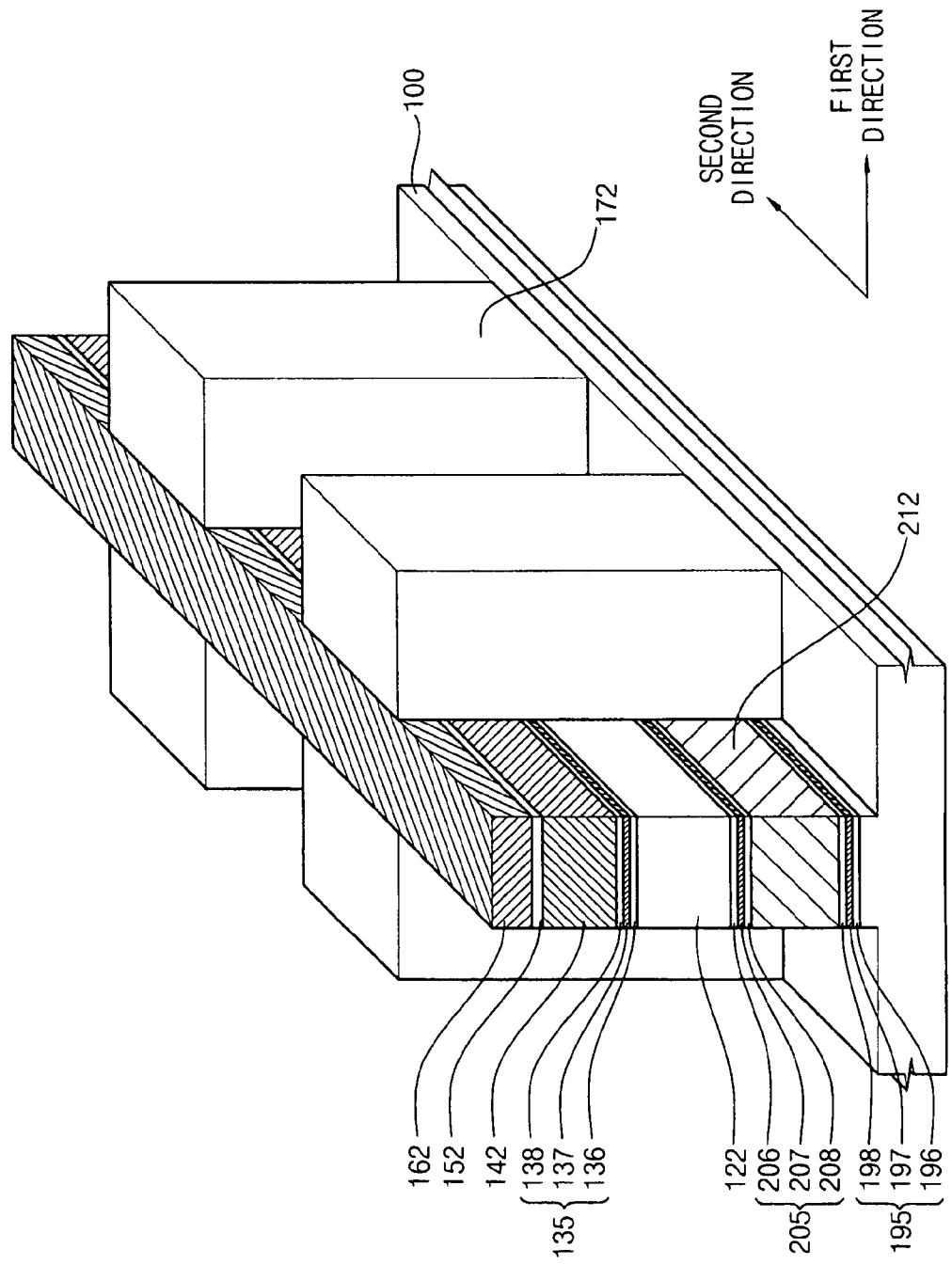
Figure 31:
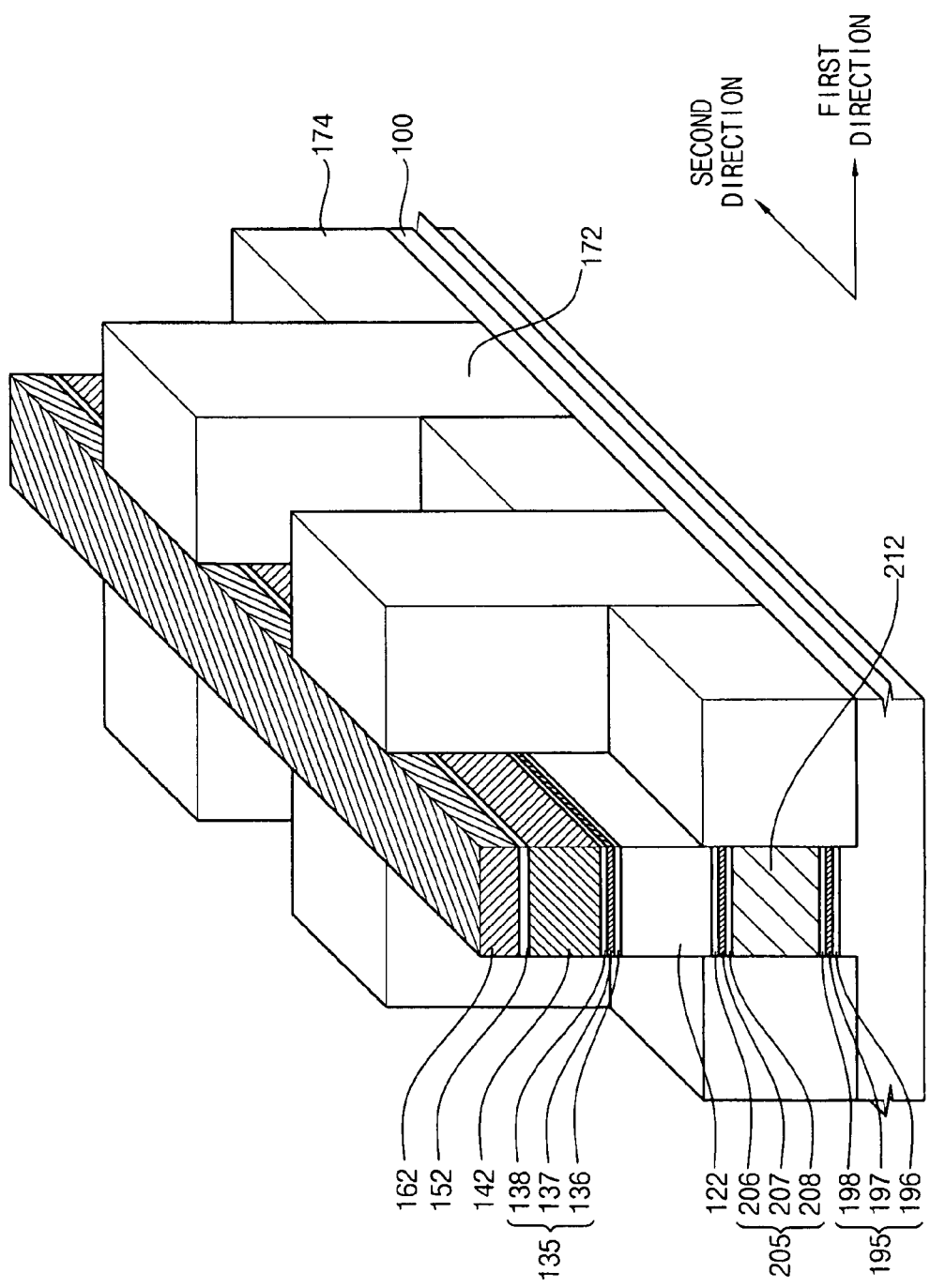
Figure 3J:
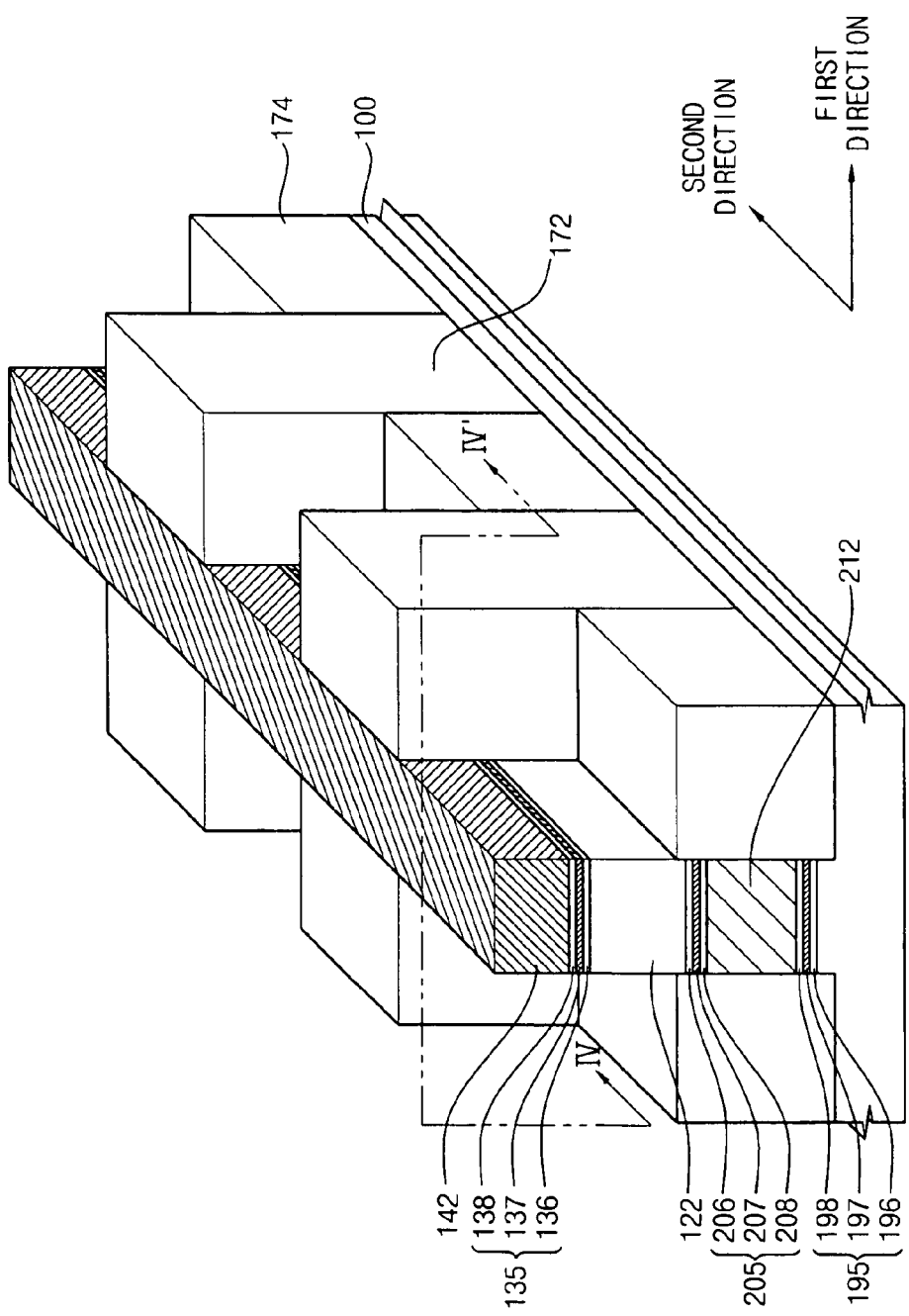
Figure 3L:
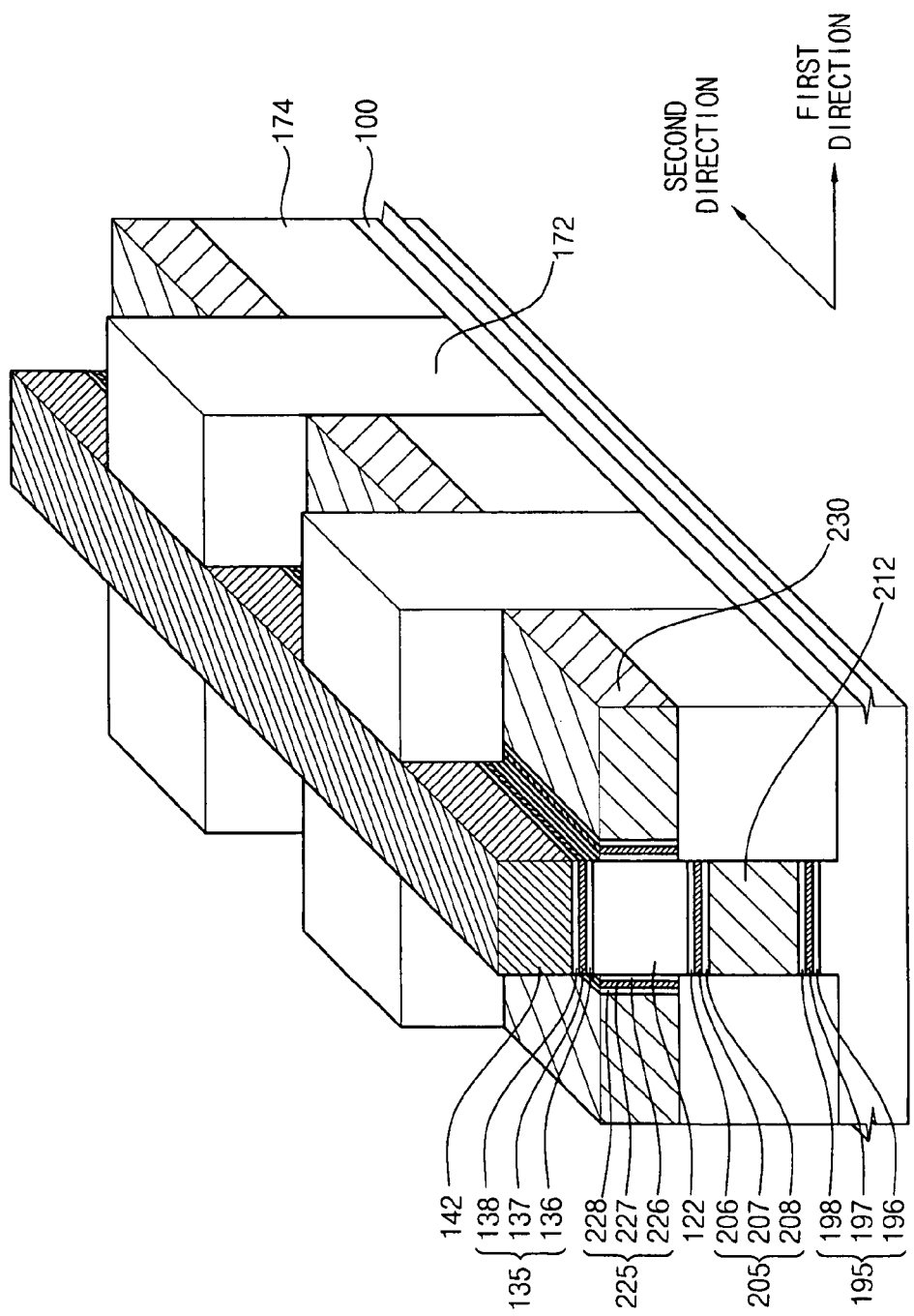
Figure 30:
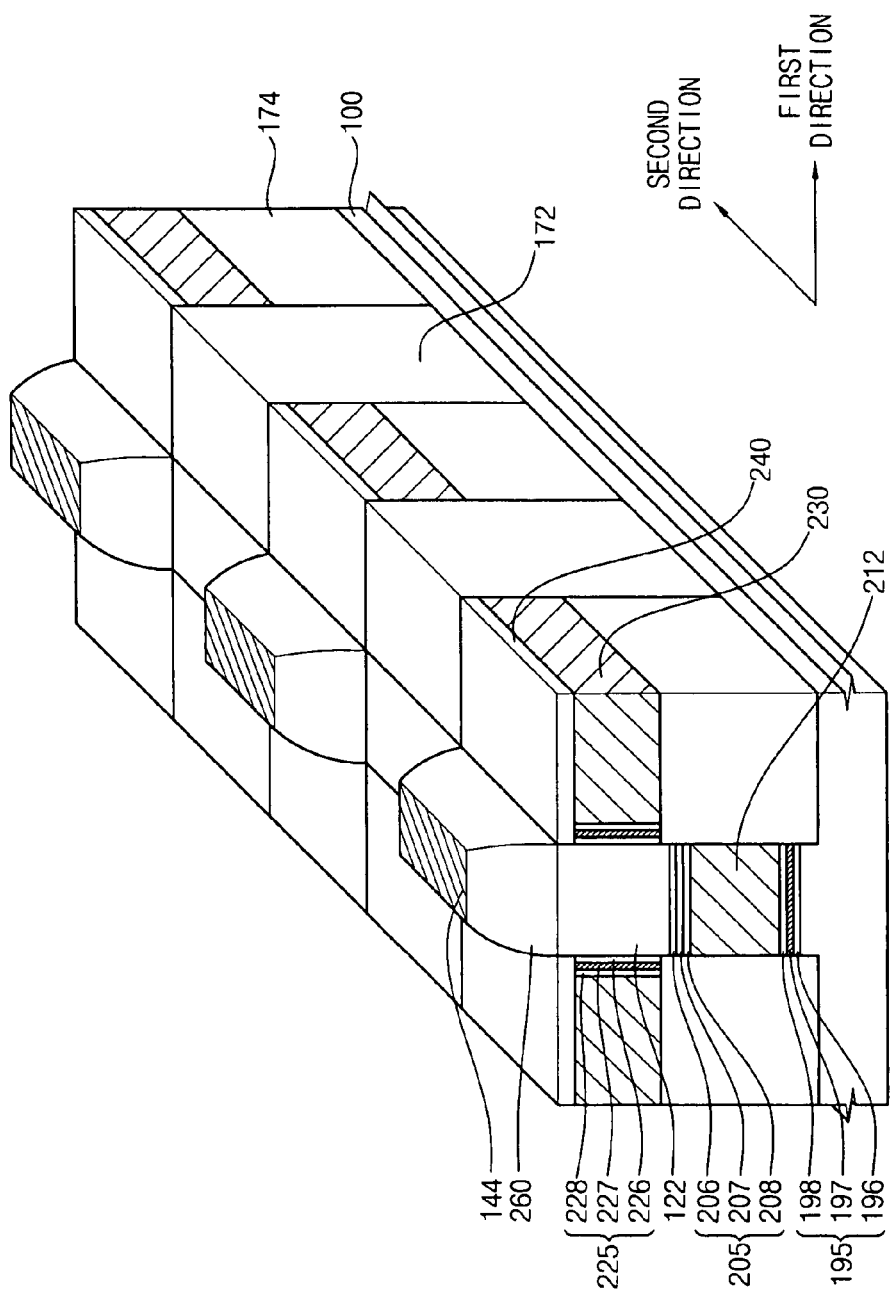
Figure 3P:
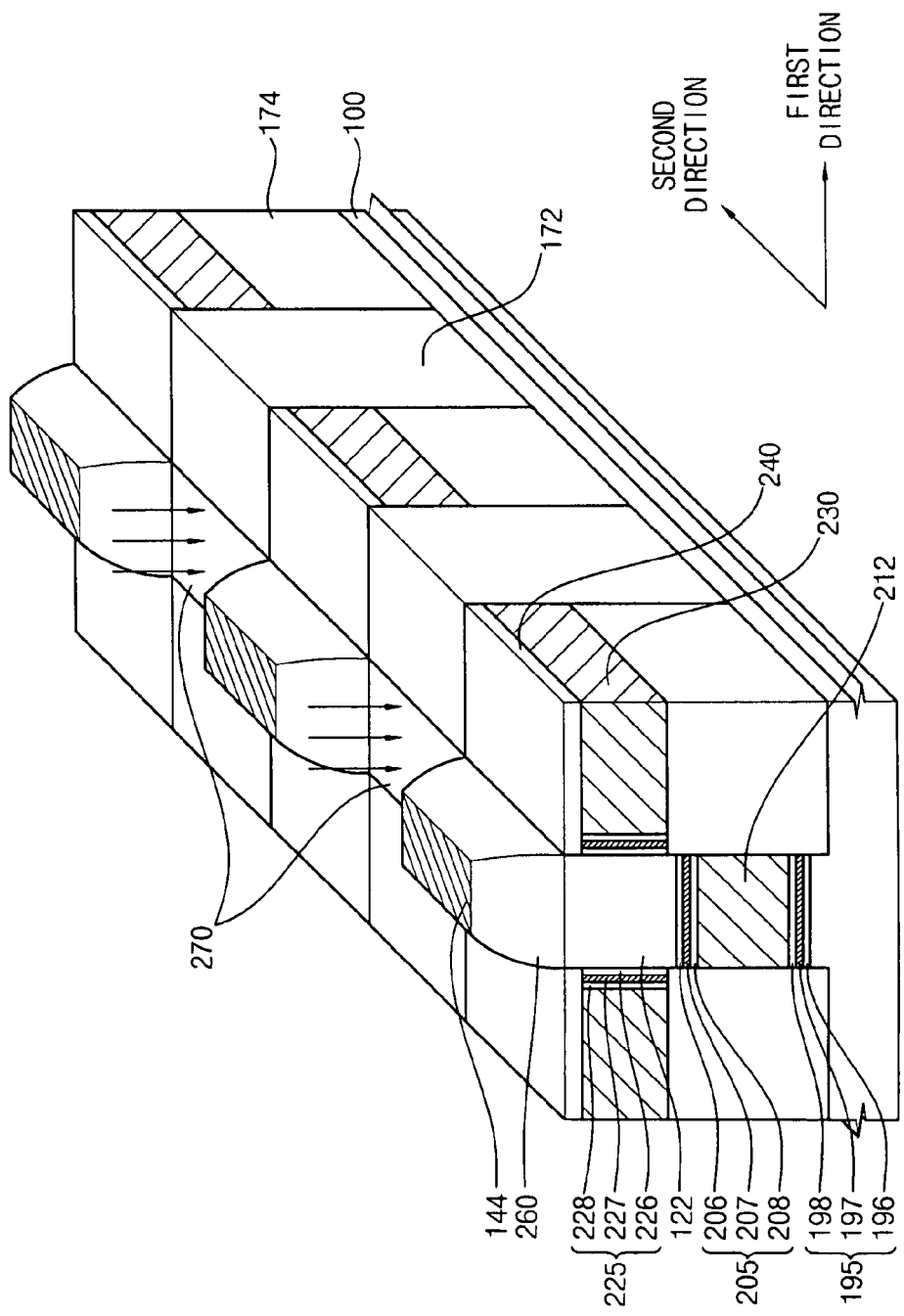

FIGS. 3A to 3P are perspective views illustrating an example embodiment method of manufacturing a memory device. Although FIGS. 3A to 3P illustrate example embodiment methods of manufacturing floating trap type memory devices, the example embodiment methods may be employed to manufacture floating gate type memory devices or volatile memory devices such as DRAM devices or the like.

As shown in FIG. 3A, a sacrificial layer 110 and an active layer 120 may be formed on a semiconductor substrate 100. The semiconductor substrate 100 and the active layer 120 may be formed using silicon or another suitable material. In an example embodiment, the semiconductor substrate 100 and the active layer 120 may be formed using single crystalline silicon or another suitable material.

The sacrificial layer 110 may be removed in a subsequent process and may be formed using a material having an etching selectivity with respect to the semiconductor substrate 100 and the active layer 120. In an example embodiment, the sacrificial layer 110 may be formed by an epitaxial growth process or the like and may include silicon germanium or another suitable material. The active layer 120 may be formed by an epitaxial growth process or the like.

As shown in FIG. 3B, a first charge trapping layer 130 and a first conductive layer 140 may be formed on the active layer 120. A first tunnel insulation layer 131, a first charge storing layer 132, and/or a first blocking layer 133 may be sequentially stacked on the active layer 120 to form the first charge trapping layer 130, and the first conductive layer 140 may be formed on the first blocking layer 133.

The first tunnel insulation layer 131 may electrically insulate the first charge storing layer 132 from the active layer 120. The first tunnel insulation layer 131 may be formed using an oxide, for example, silicon oxide and/or any other oxide. The first tunnel insulation layer 131 may be formed by a chemical vapor deposition (CVD) process, a thermal oxidation process, or any other suitable process.

The first charge storing layer 132 may store charges trapped from a channel region formed in the active layer 120 by the first charge trapping layer 130. The first charge storing layer 132 may be formed using a nitride, for example, silicon nitride and/or any other nitride, and/or using polysilicon. The first charge storing layer 132 may be formed by a CVD process, a low pressure chemical vapor deposition (LPCVD) process, or any other suitable process. A heat treatment process may be performed to densify the first charge storing layer 132 so that occurrence of undesired layers may be prevented or reduced in a process for forming the first blocking layer 133.

The first blocking layer 133 may electrically insulate the first charge storing layer 132 from the first conductive layer 140. The first blocking layer 133 may be formed using an oxide, for example, metal oxide, silicon oxide, and/or any other oxide. The first blocking layer 133 may be formed by a CVD process, an atomic layer deposition (ALD) process, or any suitable process.

The first conductive layer 140 may be patterned to form a first gate electrode (see FIG. 3N) in a successive process. The first conductive layer 140 may be formed using polysilicon, metal, metal silicide, and/or any other suitable material. The first conductive layer 140 may be formed by a CVD process, an ALD process, a physical vapor deposition (PVD) process, or another suitable process.

As shown in FIG. 3C, a pad oxide layer 150 and a mask layer 160 may be formed on the first conductive layer 140. The pad oxide layer 150 may be formed to prevent the mask layer 160 from making contact with the first conductive layer 140. Alternatively, the pad oxide layer 150 may be omitted. The pad oxide layer 150 may be formed using an oxide. The mask layer 160 may be used in patterning the first conductive layer 140. The mask layer 160 may be formed using a nitride, for example, silicon nitride and/or any other nitride.

As shown in FIG. 3D, a photoresist pattern (not shown) may be formed on the mask layer 160. The mask layer 160 may be patterned by an etching process using the photoresist pattern as an etching mask to form a mask pattern 162 on the pad oxide layer 150. The photoresist pattern may be removed by an ashing process, a stripping process, and/or any other suitable process.

The pad oxide layer 150, the first conductive layer 140, and/or the first charge trapping layer 130 may be patterned by an etching process using the mask pattern 160 as an etching mask to form a preliminary first charge trapping layer pattern 135, a preliminary first gate electrode 142, and/or a pad oxide layer pattern 152 that may be stacked on the active layer 120. The first blocking layer 133, the first charge storing layer 132, and the first tunnel insulation layer 131 in the first charge trapping layer 130 may be patterned to form the preliminary first charge trapping layer pattern 135 including a preliminary first tunnel insulation layer pattern 136, a preliminary first charge storing layer pattern 137, and/or a preliminary first blocking layer pattern 138 on the active pattern 120.

The active layer 120 and the sacrificial layer 110 may be patterned by an etching process using the mask pattern 160 as an etching mask to form a sacrificial layer pattern 112 and an active pattern 122 that are stacked on the semiconductor substrate 100. In an example embodiment, an upper portion of the semiconductor substrate 100 may be removed by the etching process.

As shown in FIG. 3E, if an insulation layer (not shown) is formed on the semiconductor substrate 100 to cover the sacrificial layer pattern 112, the active pattern 122, the preliminary first charge trapping layer pattern 135, the preliminary first gate electrode 142, the pad oxide layer pattern 152, and/or the mask pattern 162, then the insulation layer may be planarized until a top surface of the mask pattern 162 is exposed to form a first insulation layer 170. The insulation layer may be formed using an oxide, for example, silicon oxide and/or any other oxide. The first insulation layer 170 may be formed by a chemical mechanical polishing (CMP) process, an etch back process, and/or any other suitable process or combination thereof.

As shown in FIG. 3F, the first insulation layer 170 may be partially removed by an anisotropic etching process to form a first insulation layer pattern 172. The sacrificial layer pattern 112, the active pattern 122, the preliminary first charge trapping layer pattern 135, the preliminary first gate electrode 142, the pad oxide layer pattern 152, and/or the mask pattern 162 may be partially exposed.

As shown in FIG. 3G, the sacrificial layer pattern 112 may be removed from the semiconductor substrate 100 to form a first space 180. The sacrificial layer pattern 112 may be removed by a wet etching process using an etching solution, an isotropic plasma etching process using an etching gas, or any other suitable process. A solution that may selectively etch silicon, oxide, and silicon germanium may serve as an etching solution. The isotropic plasma etching process may be performed in a mixture gas including hydrogen bromide, oxygen, and/or typical atmosphere.

As shown in FIG. 3H, a second charge trapping layer pattern 195, a second gate electrode 212, and/or a third charge trapping layer pattern 205 may be formed on the semiconductor substrate 100 and occupy the first space 180.

FIGS. 4A to 4G are cross-sectional views illustrating the example embodiment memory device taken along a line III-III' in FIG. 3G illustrating an example embodiment method of forming the second and the third charge trapping layer patterns 195 and 205 and the second gate electrode 212.

Figure 4A:
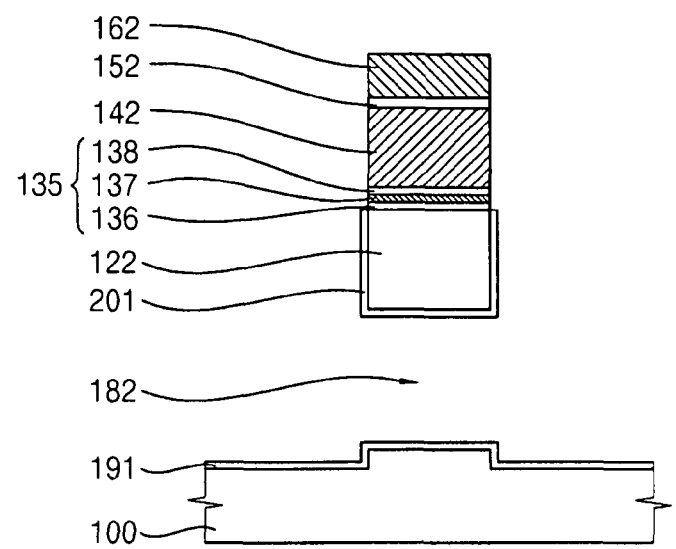
FIGS. 4A to 4G are cross-sectional views illustrating the example embodiment memory device taken along a line III-III' in FIG. 3G illustrating an example embodiment method of forming the second and the third charge trapping layer patterns 195 and 205 and the second gate electrode 212.

As shown in FIG. 4A, a surface of the semiconductor substrate 100 and a surface of the active pattern 122 may be oxidized and form a second tunnel insulation layer 191 and a third tunnel insulation layer 201, respectively. A second space 182 may be formed between the second and the third tunnel insulation layers 191 and 201. In an example embodiment, the second and the third tunnel insulation layers 191 and 201 may be formed by a thermal oxidation process.

Figure 4B:
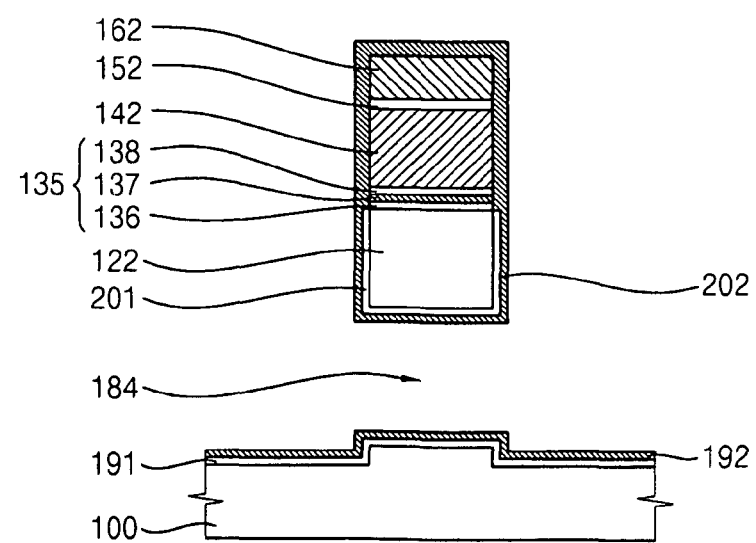

As shown in FIG. 4B, a nitride, for example, silicon nitride and/or any other nitride, polysilicon, and/or another suitable material may be deposited by a CVD process, a LPCVD process, or another suitable substance on the semiconductor substrate 100 on which the second and the third tunnel insulation layers 191 and 201, the active pattern 122, the preliminary first charge trapping layer pattern 135, the preliminary first gate electrode 142, the pad oxide layer pattern 152, and/or the mask pattern 162 may be formed. A second charge storing layer 192 may be formed on the second tunnel insulation layer 191, and a third charge storing layer 202 may be formed on the third tunnel insulation layer 201, the preliminary first charge trapping layer pattern 135, the preliminary first gate electrode 142, the pad oxide layer pattern 152 and/or the mask pattern 162. Any nitride, polysilicon, and/or other material may not completely fill up the second space 182, and thus a third space 184 may be formed between the second and the third charge storing layers 192 and 202.

Figure 4C:
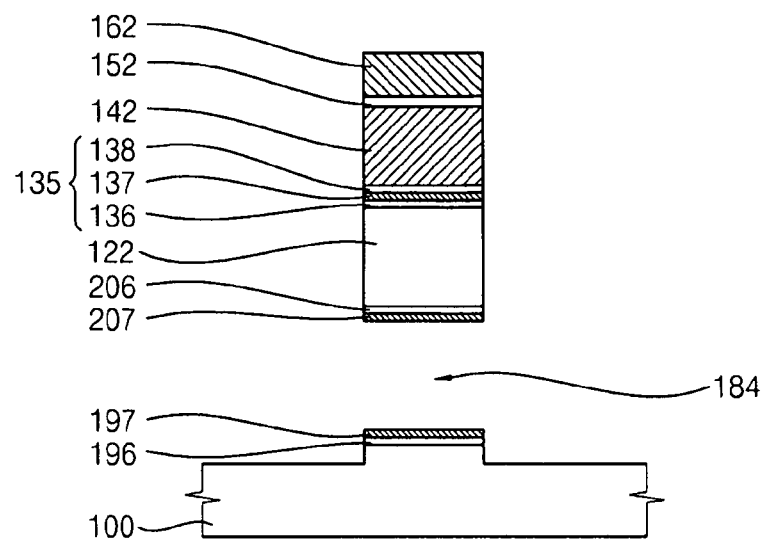

As shown in FIG. 4C, the second and the third tunnel insulation layers 191 and 201 and the second and the third charge storing layers 192 and 202 may be partially removed by an isotropic etching process to form a second tunnel insulation layer pattern 196 and/or a second charge storing layer pattern 197 on the semiconductor substrate 100 and to form a third tunnel insulation layer pattern 206 and a third charge storing layer pattern 207 on the active pattern 122.

Figure 4D:
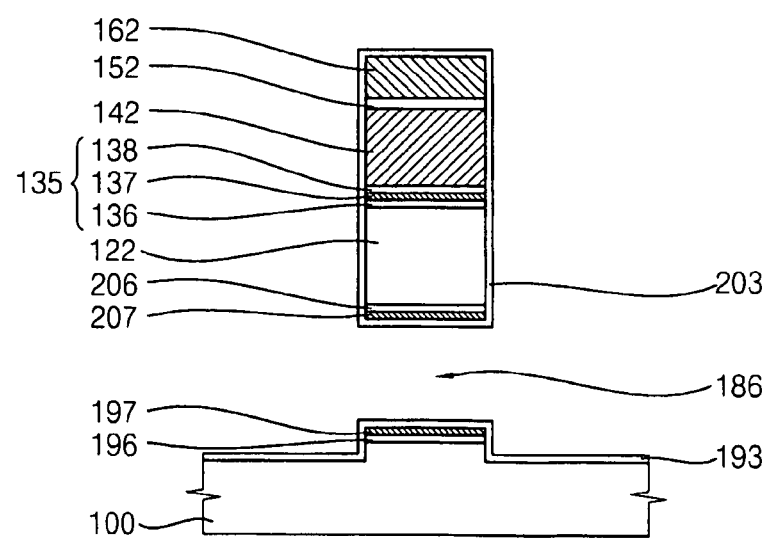

As shown in FIG. 4D, an oxide, for example, silicon oxide and/or any other oxide, may be deposited by a CVD process on the semiconductor substrate 100 on which the second and the third tunnel insulation layer patterns 196 and 206, the second and the third charge storing layer patterns 197 and 207, the active pattern 122, the preliminary first charge trapping layer pattern 135, the preliminary first gate electrode 142, the pad oxide layer pattern 152, and/or the mask pattern 162 may be formed. A second blocking layer 193 may be formed on the semiconductor substrate 100, the second tunnel insulation layer pattern 196, and/or the second charge storing layer pattern 197, and a third blocking layer 203 may be formed on the third charge storing layer pattern 207, the third tunnel insulation layer pattern 206, the active pattern 122, the preliminary first charge trapping layer pattern 135, the preliminary first gate electrode 142, the pad oxide layer pattern 152, and/or the mask pattern 162. An oxide or other material may not completely fill up the third space 184, and thus a fourth space 186 may be formed between the second and the third blocking layers 193 and 203.

Figure 4E:
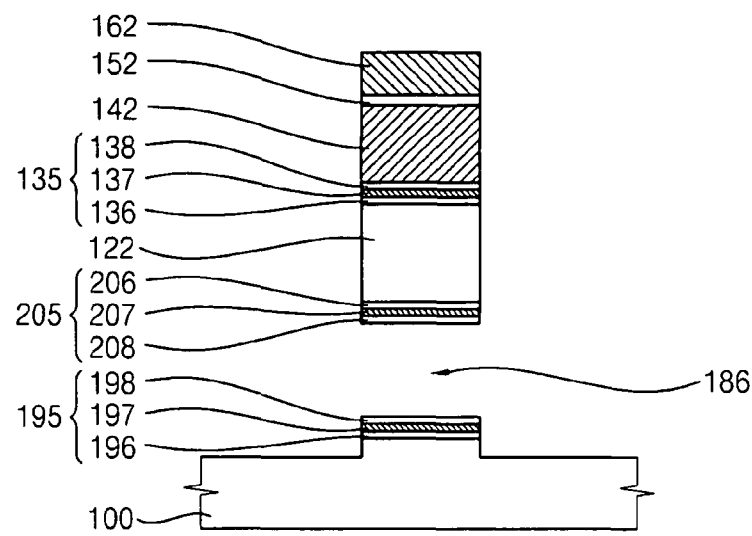

As shown in FIG. 4E, the second and the third blocking layers 193 and 203 may be partially removed by an isotropic etching process and form a second blocking layer pattern 198 on the second charge storing layer pattern 197 and may form a third blocking layer pattern 208 on the third charge storing layer pattern 207. The second charge trapping layer pattern 195 including the second tunnel insulation layer pattern 196, the second charge storing layer pattern 197, and/or the second blocking layer pattern 198 may be formed on the semiconductor substrate 100. The third charge trapping layer pattern 205 including the third tunnel insulation layer pattern 206, the third charge storing layer pattern 207, and/or the third blocking layer pattern 208 may be formed on the active pattern 122.

Figure 4F:
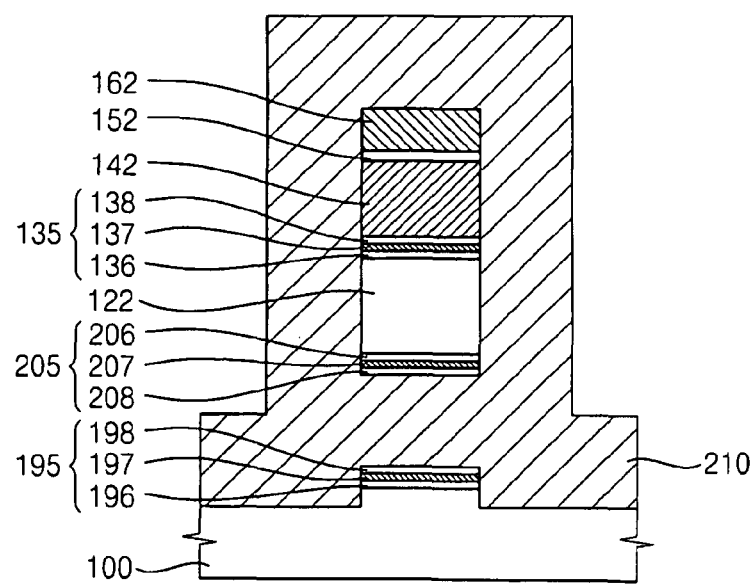

As shown in FIG. 4F, a second conductive layer 210 may be formed by a CVD process, an ALD process, a PVD process, or any other suitable process on the semiconductor substrate 100 on which the second and the third charge trapping layer patterns 195 and 205, the active pattern 122, the preliminary first charge trapping layer pattern 135, the preliminary first gate electrode 142, the pad oxide layer pattern 152, and/or mask pattern 162 may be formed. The second conductive layer 210 may occupy the fourth space 186.

Figure 4G:
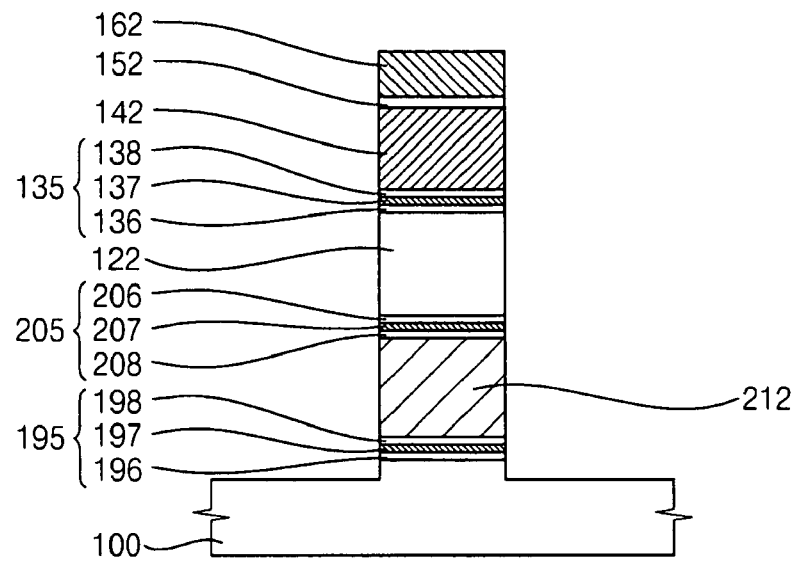

As shown in FIG. 4G, the second conductive layer 210 may be partially removed by an isotropic etching process and form a second gate electrode 212 between the second and the third charge trapping layer patterns 195 and 205.

As shown in FIG. 3I, a second insulation layer pattern 174 may be formed on the semiconductor substrate 100. If an insulation layer (not shown) is formed on portions of the semiconductor substrate 100, which may not be covered by the first insulation layer pattern 170, then the insulation layer may be planarized to form the second insulation layer pattern 174. In an example embodiment, the second layer pattern 174 may be formed to have a greater height than the third charge trapping layer pattern 205 so that the third charge trapping layer pattern 205 and a fourth charge trapping layer pattern 225 (see FIG. 3K) may be electrically insulated from each other. The second insulation layer pattern 174 may include substantially similar materials but may also include distinct materials from that of the first insulation layer pattern 170.

As shown in FIG. 3J, the mask pattern 162 and the pad oxide layer pattern 152 may be removed from the semiconductor substrate 100. Additionally, upper portions of the first insulation layer pattern 172 may also be removed so that the first insulation layer pattern 172 may have a height about the same as, that of the preliminary first gate electrode 142.

As shown in FIG. 3K, the fourth charge trapping layer pattern 225 may be formed on a sidewall of the active pattern 122. In an example embodiment, two fourth charge trapping layer patterns 225 may be formed on both sidewalls of the active pattern 122.

FIGS. 5A to 5E are cross-sectional views taken along a line IV-IV' of the example embodiment memory device in FIG. 3J illustrating a method of forming the fourth charge trapping layer pattern 225.

Figure 5A:
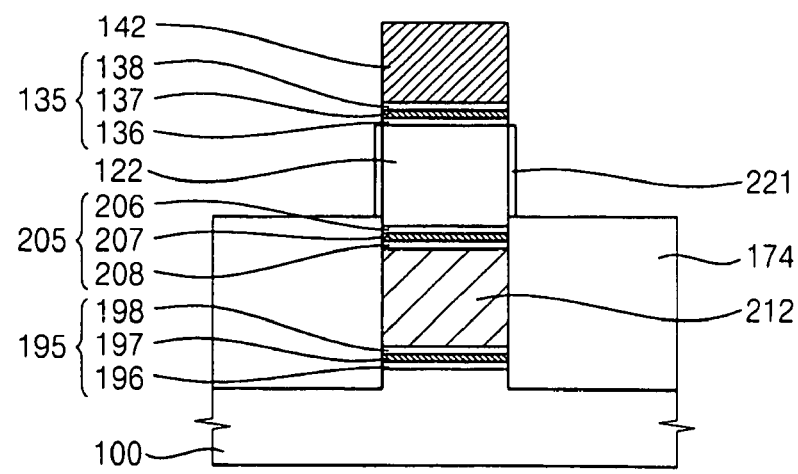
FIGS. 5A to 5E are cross-sectional views illustrating the example embodiment memory device taken along a line IV-IV' in FIG. 3J illustrating an example embodiment method of forming the fourth charge trapping layer pattern 225.

As shown in FIG. 5A, a surface of the active pattern 122 that may include silicon may be oxidized to form a fourth tunnel insulation layer 221. In an example embodiment, the fourth tunnel insulation layer 221 may be formed by a thermal oxidation process or the like.

Figure 5B:
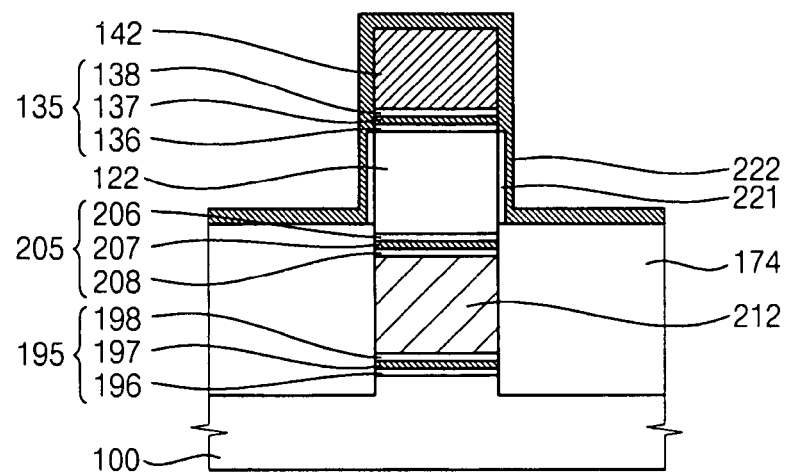

As shown in FIG. 5B, a fourth charge storing layer 222 may be formed on the second insulation layer pattern 174, the fourth tunnel insulation layer 221, the preliminary first charge trapping layer pattern 135, and/or the preliminary first gate electrode 142. The fourth charge storing layer 222 may be formed using a nitride, for example, silicon nitride and/or any other suitable nitride. The fourth charge storing layer 222 may be formed by a CVD process, a LPCVD process, or another suitable process.

Figure 5C:
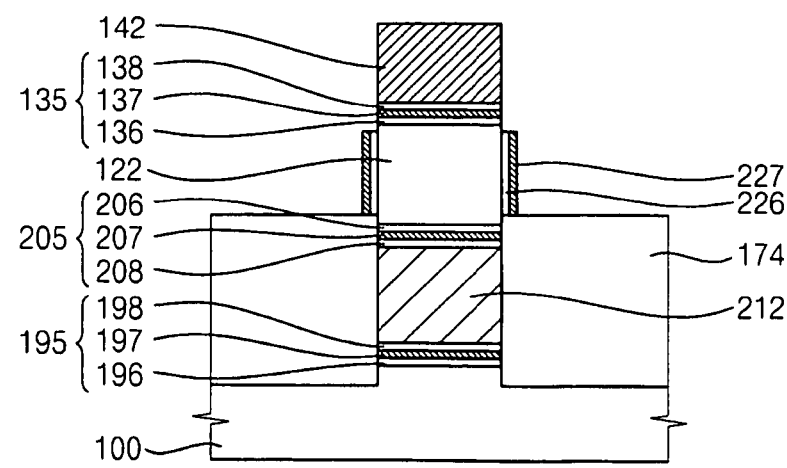

As shown in FIG. 5C, the fourth charge storing layer 222 and the fourth tunnel insulation layer 221 may be partially removed by an isotropic etching process and form a fourth tunnel insulation layer pattern 226 and a fourth charge storing layer pattern 227 on both sidewalls of the active pattern 122. In an example embodiment, the fourth tunnel insulation layer pattern 226 and the fourth charge storing layer pattern 227 may be formed at a height lower than that of the preliminary first tunnel insulation layer pattern 136 so that the fourth charge trapping layer pattern 225 may be electrically insulated from the preliminary first charge trapping layer pattern 135.

Figure 5D:
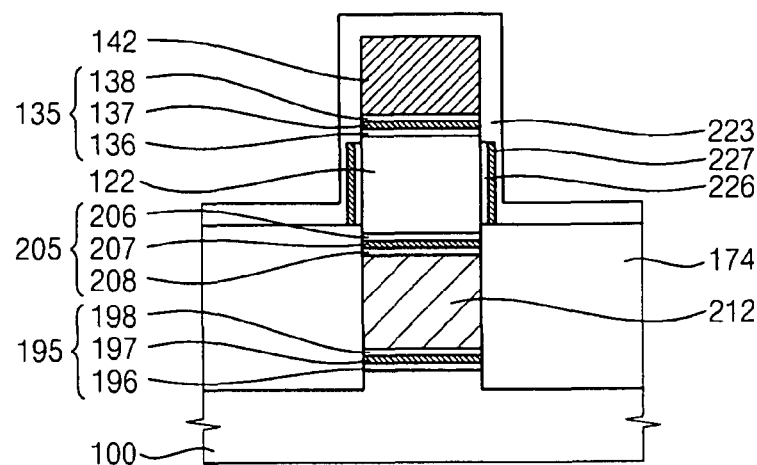

As shown in FIG. 5D, a fourth blocking layer 223 may be formed on the second insulation layer pattern 174, the fourth tunnel insulation layer pattern 226, the fourth charge storing layer pattern 227, the preliminary first charge trapping layer pattern 135, and/or the preliminary first gate electrode 142. The fourth blocking layer 223 may be formed using an oxide, for example, metal oxide, silicon oxide, and/or any oxide by a CVD process or the like.

Figure 5E:
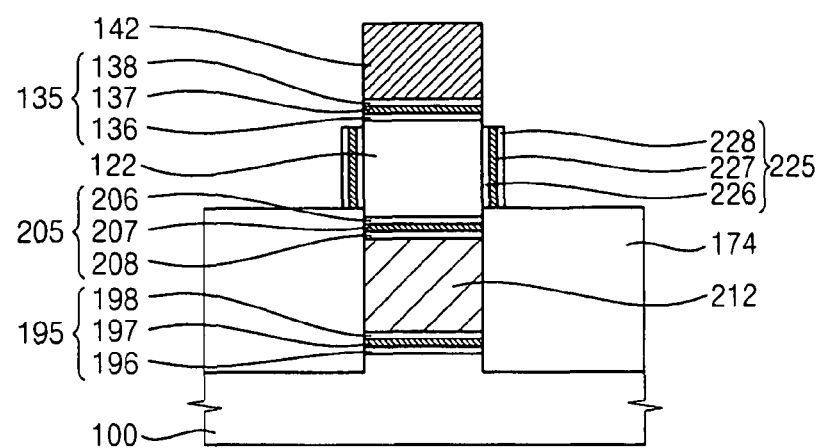

As shown in FIG. 5E, the fourth blocking layer 223 may be partially removed by an isotropic etching process to form a fourth blocking layer pattern 228 on the fourth charge storing layer pattern 227. The fourth charge trapping layer pattern 225 including the fourth tunnel insulation layer pattern 226, the fourth charge storing layer pattern 227, and/or the fourth blocking layer pattern 228 may be formed on the both sidewalls of the active pattern 122.

As shown in FIG. 3L, a third gate electrode 230 may be formed at a height about the same as that of the fourth charge trapping layer pattern 225 on the second insulation layer pattern 174. A third conductive layer (not shown) may be formed on the second insulation layer pattern 174 to cover the fourth charge trapping layer pattern 225. The third conductive layer may be formed using polysilicon, metal, metal silicide, and/or another suitable material by a CVD process, an ALD process, a PVD process, or another suitable method. The third conductive layer may be planarized until the fourth charge trapping layer pattern 225 is exposed so that the third gate electrode 230 may be formed on the fourth charge trapping layer pattern 225 and the second insulation layer pattern 174.

The third conductive layer may be planarized by a CMP process, an etch-back process, another suitable process, or any combination thereof.

As shown in FIG. 3M, a third insulation layer pattern 240 may be formed on the third gate electrode 230 and the fourth charge trapping layer pattern 225. If an insulation layer (not shown) is formed to cover the third gate electrode 230, the fourth charge trapping layer pattern 225, the preliminary first charge trapping layer pattern 135, the preliminary first gate electrode 142, and/or the first insulation layer pattern 172, then the insulation layer may be planarized until a top surface of the preliminary first gate electrode 142 is exposed, thereby forming the third insulation layer pattern 240. The third insulation layer pattern 240 may include substantially similar materials but may also include distinct materials from that of each of the first and the second insulation layer patterns 172 and 174. The insulation layer may be planarized by a CMP process, an etch-back process, another suitable process, or any combination thereof.

As shown in FIG. 3N, the preliminary first gate electrode 142 and the preliminary first charge trapping layer pattern 135 may be patterned to form a plurality of first charge trapping layer patterns 255 and a plurality of first gate electrodes 144, each of which may be placed in a second direction on the active pattern 122. The third insulation layer pattern 240 may be partially removed at a height about the same as that of the active pattern 122.

If a photoresist pattern (not shown) is formed on the preliminary first gate electrode 142, then the preliminary first gate electrode 142 may be partially removed using the photoresist pattern as an etching mask by an isotropic etching process to form the plurality of the first gate electrodes 144. The first gate electrodes 144 may be formed on portions of the active pattern 122 between the third insulation layer patterns 240. Each of the first gate electrodes 144 may have a width less than that of the active pattern 122 as measured in a first direction about perpendicular to the second direction and may have a length less than that of the third insulation layer pattern 240 measured in the second direction.

The photoresist pattern may be removed by an ashing process, a stripping process, and/or any other suitable process. The preliminary charge trapping layer pattern 135 may be partially removed using the first gate electrodes 144 as etching masks to form a plurality of first charge trapping layer patterns 255, each of which may include a first tunnel insulation layer pattern 256, a first charge storing layer pattern 257, and/or a first blocking layer pattern 257 on the active pattern 122.

As shown in FIG. 3O, spacers 260 may be formed on sidewalls of the first gate electrodes 144 and the first charge trapping layer patterns 255. A nitride, for example, silicon nitride or any other nitride, may be deposited on the active pattern 122 and the third insulation layer pattern 240 to form a nitride layer (not shown) covering the first gate electrodes 144 and the first charge trapping layer patterns 255 by a CVD process or the like. The nitride layer may be partially removed by an isotropic etching process to form the spacers 260 on portions of the active pattern 122 between the third insulation layer patterns 240.

As shown in FIG. 3P, impurities may be implanted onto the active pattern 122 using the first gate electrodes 144 and the spacers 260 as ion implantation masks to form a source/drain region 270 in the active pattern 122.

Figure 6:
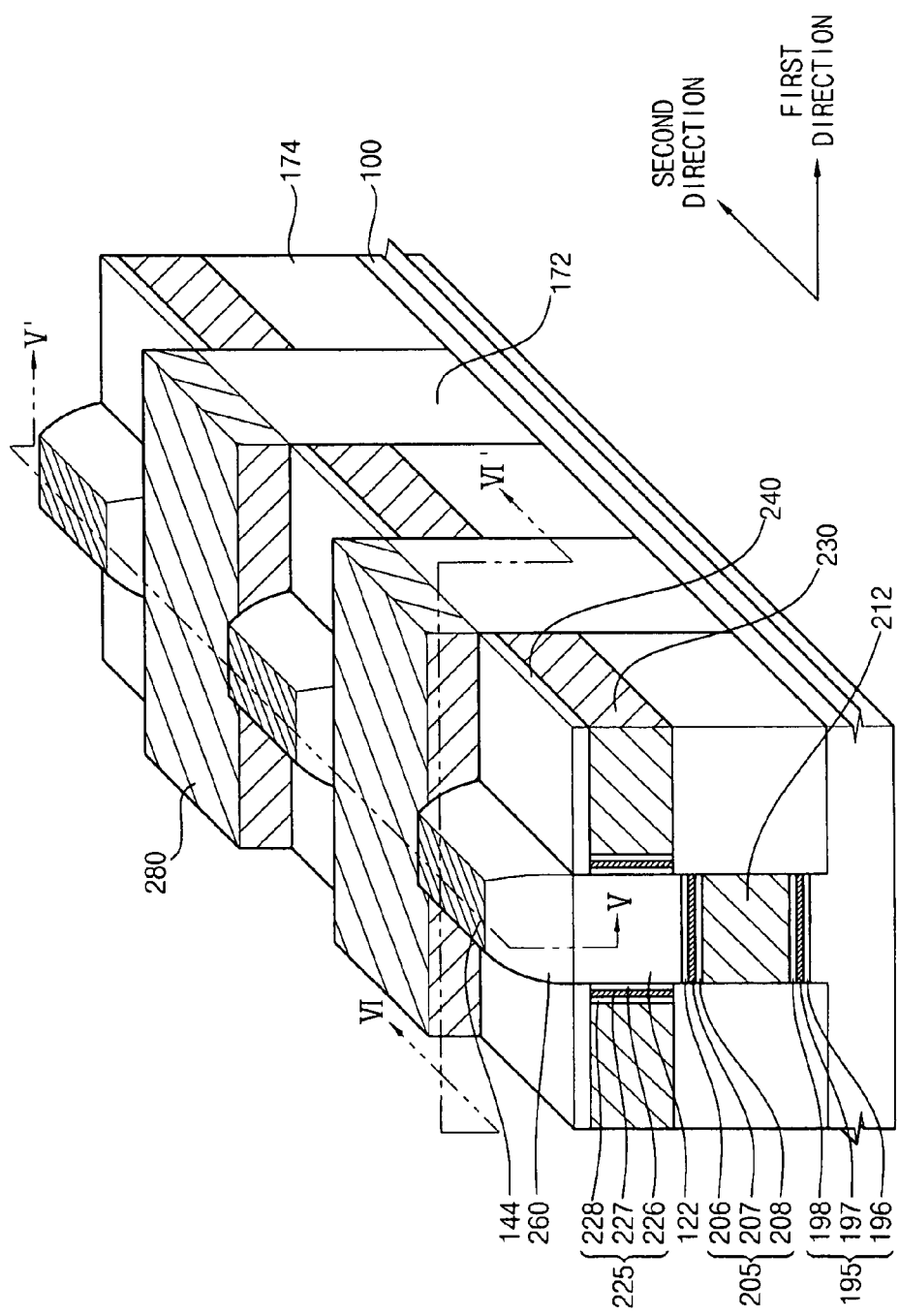
FIG. 6 is a perspective view illustrating an example embodiment memory device including a bit line.
Figure 7A:
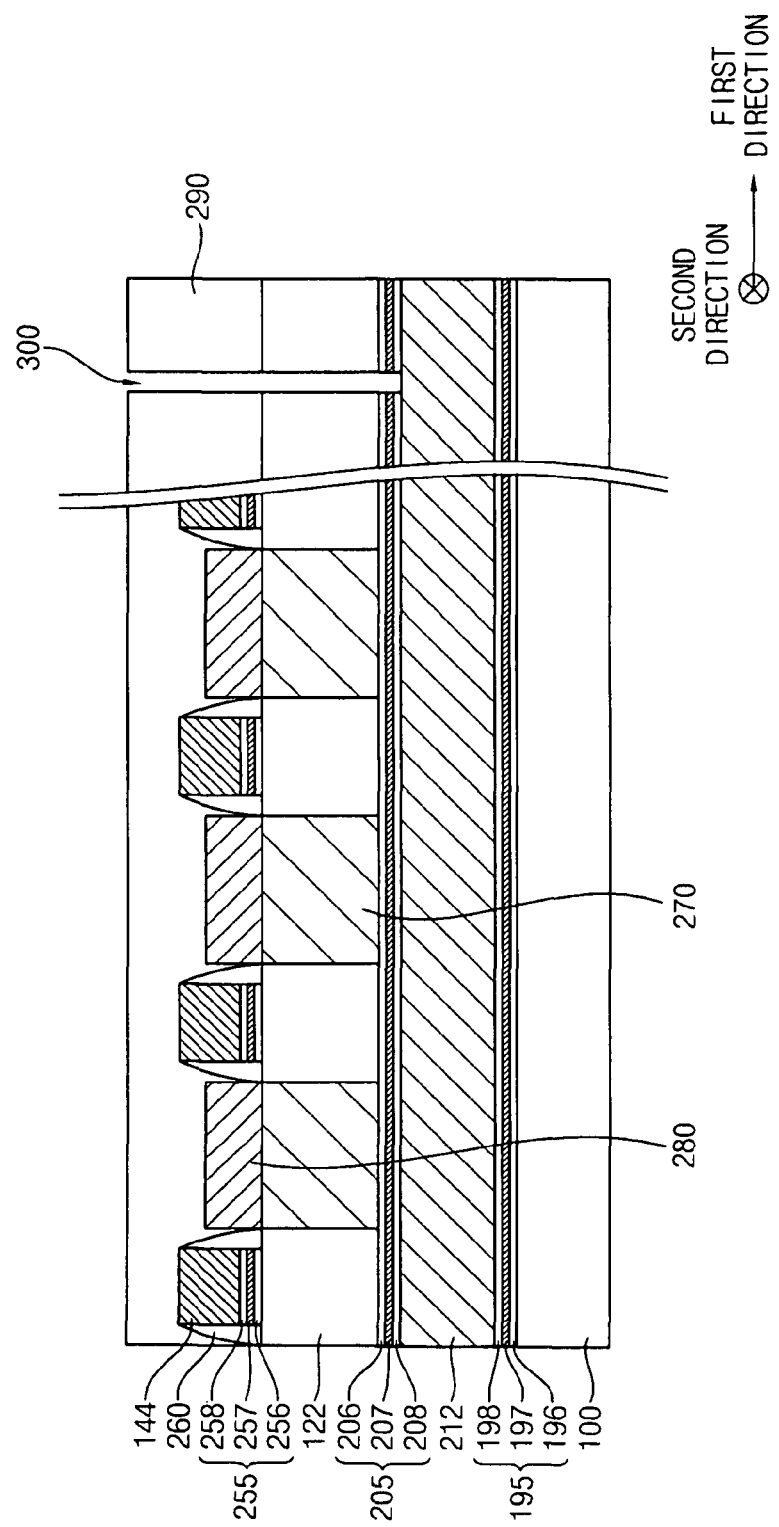
FIGS. 7A and 7B are cross-sectional views illustrating the example embodiment memory device taken along a line V-V' in FIG. 6 that displays an example embodiment method of forming a memory device including a first word line.
Figure 7B:
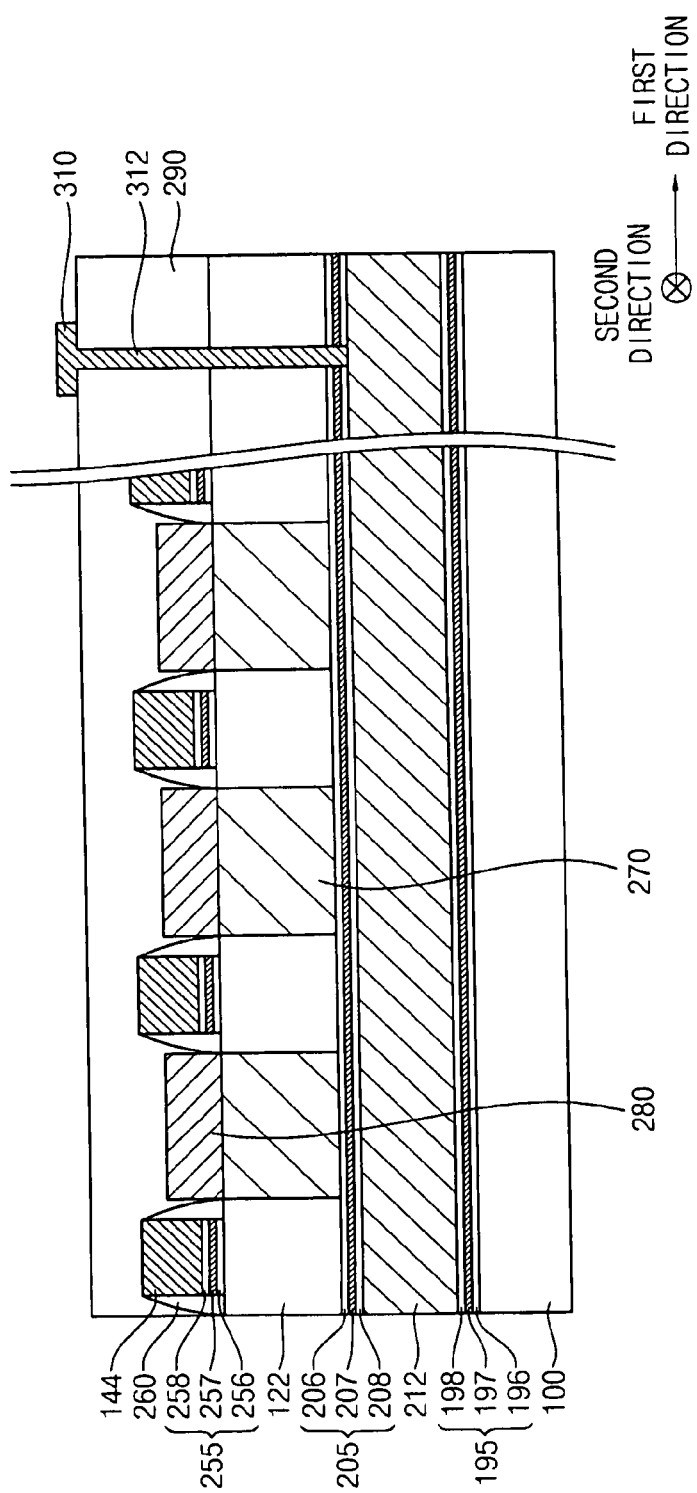
Figure 8A:
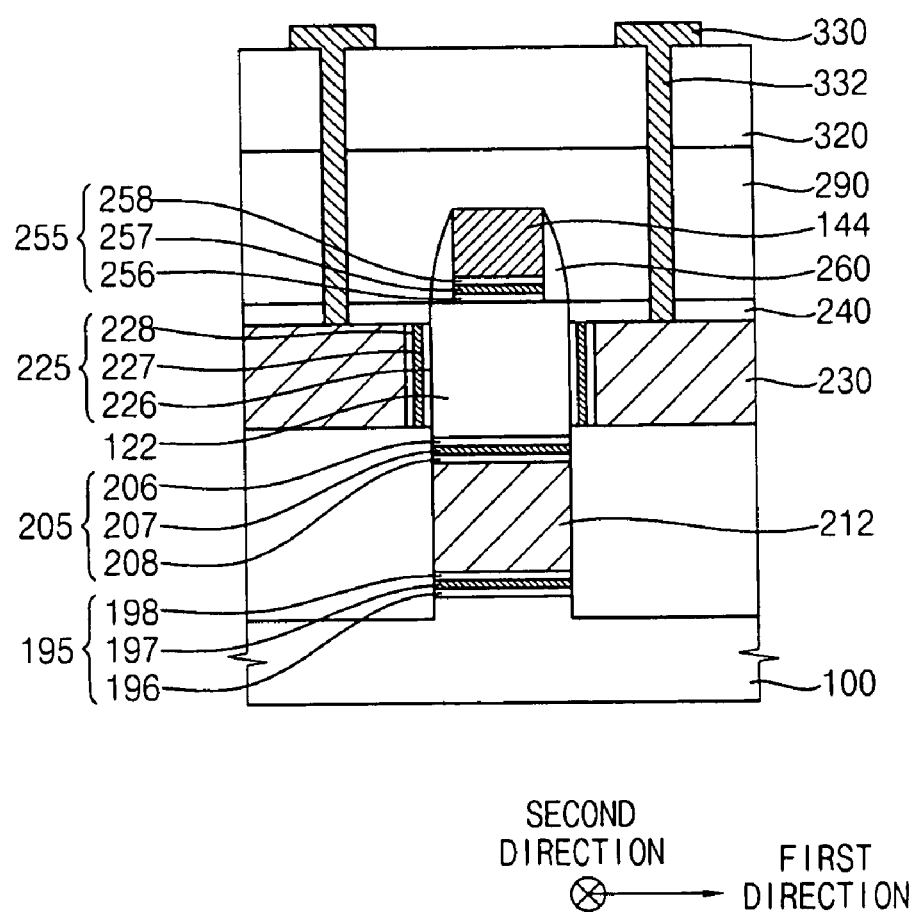
FIGS. 8A and 8B are cross-sectional views illustrating the example embodiment memory device taken along a line VI-VI' in FIG. 6 that displays an example embodiment method of forming a memory device including a second word line and a third word line.
Figure 8B:
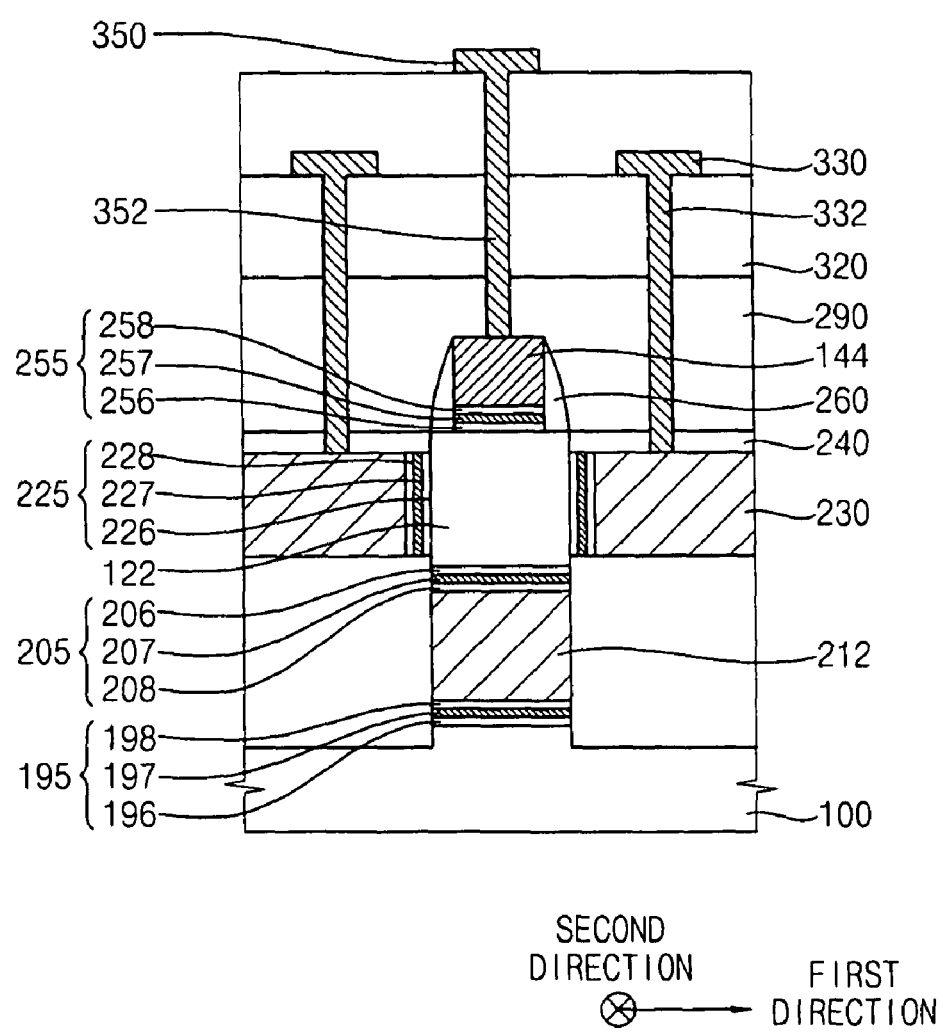

FIG. 6 is a perspective view illustrating an example embodiment memory device that may include a bit line. FIGS. 7A and 7B are cross-sectional views of the example embodiment memory device taken along a line V-V' in FIG. 6 illustrating an example embodiment method of forming a memory device that may include a first word line. FIGS. 8A and 8B are cross-sectional views of the example embodiment memory device taken along a line VI-VI' in FIG. 6 illustrating an example embodiment method of forming a memory device including a second word line and a third word line.

As shown in FIGS. 3P and 6, a plurality of bit lines 280 may be formed on the first insulation layer pattern 172 and/or the source/drain region 270. Each of the bit lines 280 may extend in a first direction and be placed sequentially in a second direction about perpendicular to the first direction. In an example embodiment, each of the bit lines 280 may reach a height lower than those of the first gate electrodes 144. The bit lines 280 may be formed using metal, metal silicide, and/or any other suitable material.

As shown in FIG. 7A, a fourth insulation layer 290 is formed on the active pattern 122 on which the first gate electrodes 144, the first charge trapping layer patterns 255, the spacers 260 and the bit lines 280 are formed, and the first and the third insulation layer patterns 172 and 240. The fourth insulation layer 290 may include substantially similar materials but may also include distinct materials from that of each of the first, second, and third insulation layer patterns 172, 174, and 240. The fourth insulation layer 290, the active pattern 122, and the third charge trapping layer pattern 205 may be partially removed to form a first opening 300 exposing a portion of the second gate electrode 212. The first opening 300 may be formed to expose an end portion of the second gate electrode 212 in the second direction in each of memory cell columns, which may extend in the second direction and may be sequentially placed in the first direction.

As shown in FIG. 7B, a first word line plug 312 and a first word line 310 may be formed and occupy the first opening 300. A conductive material, for instance a metal, metal silicide, and or any other conductive material, may be deposited on the fourth insulation layer 290 to form a fourth conductive layer (not shown) occupying the first opening 300. The fourth conductive layer may be partially removed to form the first word line plug 312 and the first word line 310, which may be adjacent to the first opening 300. The first word line 310 may have an island shape unlike a second word line 330 and a third word line 350, which are described later in detail.

As shown in FIG. 8A, a fifth insulation layer 320 may be formed on the fourth insulation layer 290 to cover the first word line 310. The fifth insulation layer 320 may include substantially similar materials but may also include distinct materials from that of the fourth insulation layer 290. The fifth insulation layer 320, the fourth insulation layer 290, and the third insulation layer pattern 240 may be partially removed to form a second opening (not shown) partially exposing the third gate electrode 230. The second opening may be formed in plural numbers to partially expose each of the third gate electrodes 230 sequentially placed in the second direction.

A second word line plug 332 and a second word line 330 may be formed on the fifth insulation layer 320 to fill the second opening. A conductive material, for example, a metal, metal silicide, and/or any conductive material, may be deposited on the fifth insulation layer 320 to form a fifth conductive layer occupying the second opening. The fifth conductive layer may be partially removed to form the second, word line plug 332 and/or the second word line 330, which may be adjacent to the second opening and may extend in the second direction.

As shown in FIG. 8B, a sixth insulation layer 340 may be formed on the fifth insulation layer 320 to cover the second word line 330. The sixth insulation layer 340 may include substantially similar materials but may also include distinct materials from that of each of the fourth and the fifth insulation layers 290 and 320. The sixth insulation layer 340, the fifth insulation layer 320, and/or the fourth insulation layer 290 may be partially removed to form a third opening (not shown) partially exposing the first gate electrode 144. In an example embodiment, the third opening may be formed in plural numbers to partially expose each of the first gate electrodes 144.

A third word line plug 352 and a third word line 350 may be formed on the sixth insulation layer 340 to fill the third opening. A conductive material, for example, a metal, metal silicide, and/or any conductive material, may be deposited on the sixth insulation layer 340 to form a sixth conductive layer occupying the third opening. The sixth conductive layer may be partially removed to form the third word line plug 352 and/or the third word line 350, which may be adjacent to the third opening and may extend in the second direction.

An example embodiment memory device may include four charge trapping layer patterns, which are formed on a top surface, a bottom surface, a right sidewall, and/or a left sidewall of the same active pattern. The memory device may store an 8- or 16-bit of logic level in a unit cell. The memory device may have increased integration without decreasing the size of unit members composing the memory device.

What is claimed is:

1. A method of manufacturing a memory device, the method comprising:
    forming an active pattern, a preliminary first charge trapping layer pattern, and a preliminary first gate electrode on a semiconductor substrate;
    stacking a second charge trapping layer pattern and a second gate electrode on a sidewall of the active pattern extending in a first direction;
    partially removing the preliminary first gate electrode and the preliminary first charge trapping layer pattern to form a first charge trapping layer pattern and a first gate electrode on the active pattern; and
    forming a source/drain region in the active pattern.

2. The method of claim 1, wherein forming the preliminary first charge trapping layer pattern includes stacking a preliminary first tunnel insulation layer pattern on the active pattern, a preliminary first charge storing layer pattern on the preliminary first tunnel insulation layer, and a preliminary first blocking layer pattern on the preliminary first charge storing layer pattern.

3. The method of claim 1, wherein stacking the second charge trapping layer pattern includes oxidizing a surface of the active pattern to form a second tunnel insulation layer, forming a second charge storing layer on the semiconductor substrate to cover the second tunnel insulation layer, partially removing the second charge storing layer and the second tunnel insulation layer, forming a second blocking layer on the semiconductor substrate to cover the second tunnel insulation layer pattern and the second charge storing layer pattern, and partially removing the second blocking layer to form a second blocking layer pattern on the second charge storing layer pattern in the first direction.

4. The method of claim 3, wherein the second charge storing layer includes a nitride or polysilicon, and the second blocking layer includes an oxide.

5. The method of claim 3, wherein the second charge storing layer, the second tunnel insulation layer, and the second blocking layer are partially removed by an isotropic etching process.

6. The method of claim 1, further comprising:
    forming a spacer on the active pattern to cover a sidewall of the first gate electrode after forming the first gate electrode.

7. A method of manufacturing a memory device, the method comprising:
    forming a sacrificial layer pattern, an active pattern, a preliminary charge trapping layer pattern, and a preliminary first gate electrode on a semiconductor substrate;
    forming a first space exposing a top surface of the semiconductor substrate and a bottom surface of the active pattern;
    forming a second charge trapping layer pattern and a second gate electrode configured to fill up the first space;
    forming a third charge trapping layer pattern on a sidewall of the active pattern in a first direction;
    forming a third gate electrode on the third charge trapping layer pattern in the first direction;
    forming a first charge trapping layer pattern and a first gate electrode on the active pattern by partially removing the preliminary first gate electrode and the preliminary first charge trapping layer pattern; and
    forming a source/drain region in the active pattern.

8. The method of claim 7, further comprising:
    forming a first insulation layer on the semiconductor substrate to cover the sacrificial layer pattern, the active pattern, the preliminary first charge trapping layer pattern, and the preliminary first gate electrode prior to forming the sacrificial layer pattern;
    planarizing the first insulation layer until a top surface of the preliminary first gate electrode is exposed; and
    forming a first insulation layer pattern partially exposing sidewalls of the sacrificial layer pattern, the active pattern, the preliminary first charge trapping layer pattern, and the preliminary first gate electrode by partially removing the first insulation layer.

9. The method of claim 7, wherein forming the preliminary first charge trapping layer pattern includes forming a preliminary first tunnel insulation layer pattern on the active pattern, forming a preliminary first charge storing layer pattern on the preliminary first tunnel insulation layer pattern, and forming a preliminary first blocking layer pattern on the preliminary first charge storing layer pattern.

10. The method of claim 7, wherein forming the second charge trapping layer pattern and the second gate electrode includes forming a second tunnel insulation layer pattern on the bottom surface of the active pattern, forming a second charge storing layer pattern on the second tunnel insulation layer, forming a second blocking layer pattern on the second charge storing layer pattern, and forming the second gate electrode on the second blocking layer pattern.

11. The method of claim 10, wherein the second tunnel insulation layer pattern and the second blocking layer pattern include an oxide, and the second charge storing layer pattern includes a nitride or polysilicon.

12. The method of claim 10, further comprising:
    forming a fourth charge trapping layer pattern on the semiconductor substrate while forming the second charge trapping layer pattern, wherein the fourth charge trapping layer pattern includes a fourth tunnel insulation layer, a fourth charge storing layer pattern, and a fourth blocking layer pattern.

13. The method of claim 12, wherein forming the second charge trapping layer pattern and the second gate electrode includes forming a second tunnel insulation layer and a fourth tunnel insulation layer by oxidizing a surface of the active pattern and a surface of the semiconductor substrate, respectively.

14. The method of claim 13, wherein forming the second charge trapping layer pattern and the second gate electrode further includes forming a second charge storing layer and a fourth charge storing layer, wherein the second charge storing layer is configured to cover the second tunnel insulation layer, and the fourth charge storing layer is configured to cover the fourth tunnel insulation layer, wherein a second space is formed between the second and the fourth charge storing layers.

15. The method of claim 14, wherein forming the second charge trapping layer pattern and the second gate electrode further includes partially removing the second and the fourth charge storing layers and the second and the fourth tunnel insulation layers, the second tunnel insulation layer pattern, the second charge storing layer pattern, the fourth tunnel insulation layer pattern, and the fourth charge storing layer pattern.

16. The method of claim 15, wherein forming the second charge trapping layer pattern and the second gate electrode further includes forming a second blocking layer, a fourth blocking layer, and a third space between the second and the fourth blocking layers.

17. The method of claim 16, wherein forming the second charge trapping layer pattern and the second gate electrode further includes partially removing the second and the fourth blocking layers, configuring the second blocking layer pattern to be formed on the second charge storing layer pattern, and configuring the fourth blocking layer pattern to be formed on the fourth charge storing layer pattern.

18. The method of claim 17, wherein forming the second charge trapping layer pattern and the second gate electrode further includes forming a conductive layer on the semiconductor substrate to occupy the third space.

19. The method of claim 18, wherein forming the second charge trapping layer pattern and the second gate electrode further includes partially removing the conductive layer to form the second gate electrode between the second and the fourth blocking layer patterns.

20. The method of claim 7, further comprising:
forming a second insulation layer pattern on the semiconductor substrate to partially cover the sacrificial layer pattern, the second gate electrode, the second charge trapping layer pattern, and the active pattern prior to forming the third charge trapping layer pattern, wherein the third charge trapping layer pattern and the third gate electrode are formed on the second insulation layer pattern.

21. The method of claim 7, further comprising:
forming a spacer on the active pattern to cover a sidewall of the first gate electrode after forming the first gate electrode.

* * * * *